(12) United States Patent
Nishihara et al.

(10) Patent No.: US 8,285,916 B2
(45) Date of Patent: Oct. 9, 2012

(54) STORAGE DEVICE

(75) Inventors: Toshiyuki Nishihara, Kanagawa (JP); Takeshi Ishimoto, Tokyo (JP)

(73) Assignee: Sony Corporation, Tokyo (JP)

( * ) Notice: Subject to any disclaimer, the term of this patent is extended or adjusted under 35 U.S.C. 154(b) by 431 days.

(21) Appl. No.: 11/446,367

(22) Filed: Jun. 5, 2006

(65) Prior Publication Data

US 2006/0285397 A1 Dec. 21, 2006

(30) Foreign Application Priority Data

Jun. 6, 2005 (JP) .............................. P2005-165234
Apr. 19, 2006 (JP) .............................. P2006-115779

(51) Int. Cl.
*G06F 12/02* (2006.01)

(52) U.S. Cl. ................... 711/103; 365/189.04; 711/150; 711/168; 711/206

(58) Field of Classification Search ................ 711/103, 711/150, 168, 206; 365/189.04
See application file for complete search history.

(56) References Cited

U.S. PATENT DOCUMENTS

| | | | | |
|---|---|---|---|---|
| 5,987,575 | A * | 11/1999 | Yamaguchi | 711/162 |
| 6,081,878 | A | 6/2000 | Estakhri et al. | |
| 6,105,113 | A * | 8/2000 | Schimmel | 711/146 |
| 6,260,107 | B1 * | 7/2001 | Uchiyama et al. | 711/105 |
| 6,691,205 | B2 * | 2/2004 | Zilberman | 711/103 |
| 7,398,363 | B2 * | 7/2008 | Innan et al. | 711/161 |
| 2004/0143710 | A1 * | 7/2004 | Walmsley | 711/144 |
| 2005/0120191 | A1 * | 6/2005 | Akkary et al. | 712/217 |

FOREIGN PATENT DOCUMENTS

| | | |
|---|---|---|
| JP | 05-282889 A | 10/1993 |
| JP | 07-244992 A | 9/1995 |
| JP | 08-077066 A | 3/1996 |
| JP | 11-161558 A | 6/1999 |
| JP | 2000-510634 A | 8/2000 |
| JP | 2002-260390 | 9/2002 |
| JP | 2003-216507 A | 7/2003 |
| JP | 2004-533029 A | 10/2004 |
| JP | 2005-115561 A | 4/2005 |
| WO | WO-02/058074 A2 | 7/2002 |
| WO | WO-02/058074 A3 | 7/2002 |
| WO | WO-2004/021191 A1 | 3/2004 |

OTHER PUBLICATIONS

Japanese Office Action issued Oct. 25, 2012 for corresponding Japanese Application No. 2006-115779.
Japanese Office Action issued Apr. 17, 2012 for corresponding Japanese Application No. 2006-115779.

* cited by examiner

*Primary Examiner* — Jae Yu
(74) *Attorney, Agent, or Firm* — Rader Fishman & Grauer, PLLC

(57) ABSTRACT

A storage device, enabling elimination of redundant write operations of non-selected data and enabling optimization of arrangement of pages to a state efficient for rewriting, having two flash memories which can be accessed in parallel, a page register for acquiring data in parallel from the flash memories and temporarily storing the same, and a control circuit having a built-in RAM in which is constructed an address conversion table for managing correspondence between logical addresses and physical addresses in units of data stored in parallel in the page register, wherein data is rewritten by updating of the address conversion table and additional writing into a storage medium.

6 Claims, 22 Drawing Sheets

| LA | PA |
|---|---|
| 0x0000 | 0x0000 |
| 0x0001 | 0x0001 |
| ⋮ | ⋮ |
| 0x5500 | 0x0180 |
| ⋮ | ⋮ |
| 0x7FFF | 0x6FFF |

| LA | PA0 | PA1 |
|---|---|---|
| 0x00 | 0x00 | 0x7A |
| 0x01 | 0x70 | 0x01 |
| 0x02 | 0x02 | 0x02 |
| ⋮ | ⋮ | ⋮ |
| 0x40 | 0x71 | 0x7C |
| ⋮ | ⋮ | ⋮ |
| 0x6F | 0x6F | 0x6F |

| LPA | PPA |
|---|---|
| 0x0000 | 0x0000 |
| 0x0001 | 0x0001 |
| ⋮ | ⋮ |
| 0x5500 | 0x0180 |
| ⋮ | ⋮ |
| 0x7FFF | 0x6FFF |

| LBA | DEF | SID |
|---|---|---|
| 0x00 | 0 | 0x00 |
| 0x01 | 1 | 0x10 |
| 0x02 | 0 | 0x00 |
| ⋮ | ⋮ | ⋮ |
| 0x6F | 0 | 0x00 |

| SID | DEF0 | SOF0 | DEF1 | SOF1 |
|---|---|---|---|---|
| 0x00 | 1 | 0x0 | 0 | 0x0 |
| 0x01 | 1 | 0x1 | 0 | 0x0 |
| ⋮ | | ⋮ | | ⋮ |
| 0x10 | 0 | 0x0 | 1 | 0x4 |
| ⋮ | | ⋮ | | ⋮ |
| 0x1F | 0 | 0x0 | 0 | 0x0 |

| LPA | PPA |
|---|---|
| 0x0000 | 0x0000 |
| 0x0001 | 0x0001 |
| ⋮ | ⋮ |
| 0x5500 | 0x0180 |
| ⋮ | ⋮ |
| 0x7FFF | 0x6FFF |

| LBA | DEF | SID |
|---|---|---|
| 0x00 | 0 | 0x00 |
| 0x01 | 1 | 0x00 |
| 0x02 | 0 | 0x00 |
| ⋮ | ⋮ | ⋮ |
| 0x6E | 1 | 0x1F |
| 0x6F | 0 | 0x00 |

| SID | Last | Chip | SOF |
|---|---|---|---|
| 0x00 | 0 | 0x0 | 0x0 |
| 0x01 | 1 | 0x2 | 0x0 |
| 0x02 | 0 | 0x1 | 0x0 |
| ⋮ | ⋮ | ⋮ | ⋮ |
| 0x1F | 0 | 0x1 | 0x6 |
| 0x20 | 0 | 0x2 | 0xA |
| 0x21 | 1 | 0x3 | 0x4 |
| ⋮ | ⋮ | ⋮ | ⋮ |
| 0x3F | 0 | 0x0 | 0x9 |

STORAGE DEVICE

CROSS REFERENCES TO RELATED APPLICATIONS

The present invention contains subject matter related to Japanese Patent Application No. 2005-165234 filed in the Japan Patent Office on Jun. 6, 2005, and Japanese Patent Application No. 2006-115779 filed in the Japan Patent Office on Apr. 19, 2006 the entire contents of which being incorporated herein by reference.

BACKGROUND OF THE INVENTION

1. Field of the Invention

The present invention relates to a storage device including a non-volatile memory, more particularly relates to a speed-up of data transfer in a storage device including a flash memory.

2. Description of the Art

In recent years, flash memories have been attracting attention as storage media of digital still cameras and mobile computer equipment.

A flash memory is a semiconductor memory using tunneling or hot electron acceleration to make electrons pass through a gate insulation film and injecting these into a floating gate or a trap layer to change a threshold value of a cell transistor and thereby store data. Each memory cell can be configured by just one transistor using a stacked gate structure, NMOS structure, or the like, therefore an inexpensive and large capacity memory can be realized. As a representative example thereof, a NAND type flash memory can be explained.

FIG. 1 is a diagram showing an example of the internal configuration of a NAND type flash memory. In the NAND type flash memory of FIG. 1, a plurality of memory units 1-1 to 1-n connected to bit lines BL1 to BLn are arranged in an array (vertically and horizontally). For example, a gate of a selection transistor 2 is connected to a selection gate line SL1, while a gate of a selection transistor 3 is connected to a selection gate line SL2. Further, gates of memory cells N0 to N15 are connected to word lines WL0 to WL15.

The memory cells N0 to N15 have stacked gate structures and store data according to the amounts of charge stored in the floating gates. Namely, when many electrons are stored in a floating gate, the threshold value of the transistor rises, therefore any penetration of current to a memory unit 1 (-1 to -n) from one of the charged bit lines BL1 to BLn is detected at an access circuit including a sense amplifier etc. and data is judged.

Such a NAND type flash memory does not have to provide a contact region to the bit line for each memory cell, therefore is suitable for a particularly large capacity and inexpensive storage device.

In general, the programming speed of a flash memory is very slow. Several hundreds of microseconds are required per cell. Further, data can not be overwritten, therefore it is necessary to erase the data preceding the programming. A time of as long as several milliseconds is taken for this. Such a problem is coped with by parallel processing of many memory cells.

Namely, by simultaneously writing data in a block into for example a memory cell group 5 connected to the same word line WL0 and forming a page unit and by further erasing in a block all of a cell block 6 formed by a page group sharing memory units, the transfer speed of a program is improved.

Specifically, for example ISSCC2002 Draft, p. 106, Session 6.4, discloses a 1 Gb NAND type flash memory having a page size of 2 kbytes and an erasure block size of 128 kbytes (kB). Namely, by erasing a 128 kbyte memory cell group in one memory array in parallel and programming memory cells for each 2 kbytes in parallel, a program transfer speed of 10 MB/s is realized.

Further, in recent years, flash memories have increasingly been made multi-leveled and miniaturized. In order to cope with the drop in the signal amount accompanying this, writing techniques having less adverse influence upon non-selected cells have been studied and put into use.

For example, in NAND type flash memories, ones limiting the writing sequence of pages in the erasure blocks are becoming the mainstream. Japanese Patent Publication (A) No. 2002-260390 etc. disclose a writing routine using the technique called "local self-boost" as one of these. An example of such writing in the NAND type flash memory of FIG. 1 will be explained below.

For example, when writing in a memory cell N1 and injecting electrons into its floating gate, first the word lines WL0 and WL2 before and after the memory cell N1 and sandwiching it therebetween are made 0V, the selection transistor 2 is turned on, and the selection transistor 3 is turned off. Here, the bit line BL1 is made 0V, an adjacent bit line BL2 not for writing is made 3V, the selection word line WL1 is made 20V, and all word lines WL3 to WL15 other than that are boosted up to 10V. When using such a writing routine, the nodes sandwiched between word lines WL0 and WL2 at 0V and linked with the non-selected bit line are disconnected from the other nodes and rise in potential up to about 10V upon receiving coupling from the word line WL1. On the other hand, for the selected memory cell N1, only when the adjacent cell transistor N0 is in a depletion state, the 0V applied to the bit line BL1 is transmitted to a channel of the cell transistor N1 whereby the writing is executed. Namely, when using the writing technique described above, the adjacent cell on the bit line side of a cell for writing is erased and become a depletion state. For this reason, it is essential that the entire block be erased, then write operations be performed sequentially for the memory cells N15, N14, N13, . . . , N0.

In this way, the trend in large capacity flash memories in recent years is not to allow random writing even in page writing and to make sequential writing from a higher address toward a lower address in a block essential.

SUMMARY OF THE INVENTION

In recent years, in order to overcome the limits of the size of the consumed power, the length of the seek time, the impact resistance, and the portability of hard disk drives, flash memories have been considered promising alternatives. However, as explained above, a flash memory cannot be increased in speed unless made large in access units. Further, data cannot be overwritten, so rewriting needs erasure and the erasure blocks at that time are even larger. The erasure unit being tens of times larger than the access unit in this way is a general specification in a flash memory having a long erasure time and exhibiting disturbances in the non-selected cells at the time of writing. However, the write efficiency is remarkably lowered due to this. For example, when a small region is to be updated, an operation to copy existing data becomes necessary as explained above, so the write efficiency is remarkably lowered.

For example, assume for example a flash memory having a transfer rate of 10 MB/s writing pages in units of 2 kB and erasing blocks in units of 128 kB is used to configure a storage device to take the place of a hard disk drive. If desiring to raise the transfer rate up to the 160 MB/s targeted for high speed storage in a serial ATA connection, it is necessary employ a multi-bank or multi-chip configuration and for example operate 16 memory arrays in parallel.

FIG. 2 is a diagram showing a conceptual view of a flash memory configuring such a storage device. In FIG. 2, 20 indicates an actual page region, 21 indicates an actual erasure block region, 22 indicates a memory region, 23 indicates a buffer memory, and 25 indicates an already erased block.

In FIG. 2, in order to actualize high speed transfer, the 16 arrays AR0 to AR15 are simultaneously operated. In this case, at the time of writing data, for example pages P0 and P1 are simultaneously written, while at the time of erasing data, blocks B0 to B15 are simultaneously erased. At this time, the actual page region 20 forming the simultaneous writing unit reaches 32 kB, while the actual erasure block region 21 forming the simultaneous erasure unit reaches 2 MB. Namely, even when rewriting just one sector (512 B) of data, the worst case 2 MB of data has to be copied and moved.

At this time, for example, in a usual NAND type flash memory, 1 block includes 64 pages. 30 ms is required for reading and copying all of them. In a multi-level type NAND type flash memory, 1 block includes 128 pages. The write speed per se of each page is slow, therefore 100 ms or more is required for reading and copying all of them. Accordingly, the actual transfer performance ends up becoming remarkably low. In view of these circumstances, present-day storage devices using flash memories can only give a transfer performance considerably lower than that of a hard disk drive—particularly at the time of writing.

On the other hand, in the usual file system, the cluster size forming the minimum writing unit is about 4 kB. This unit is used for random access. Further, in a usual file storage device, according to the ATA and other interface specifications, a sector unit of for example 512 bytes is used for random access. In this case, for example, there are frequently requests for rewriting only pages P0 and P1. However, when performing such access in the device explained above, in conclusion, the entire actual erasure block region 21 needs to be erased. If there is a valid file in a non-selected region in that, it is necessary to protect that from erasure. An example of the typical means for dealing with this is explained below with reference to FIG. 2.

1. First, the data of the entire actual erasure block region 21 is read out from the flash memory to the memory region 22 of a separately provided buffer memory 23.

2. Next, the data corresponding to pages P0 and P1 is updated in the memory region 22.

3. Next, the block region 21 on the flash memory is erased.

4. Finally, all block data of the memory region 22 after updating is written back into the above erased region 21.

Namely, to write 4 k bytes, actually erasure and the reading and writing of 2 MB of data become necessary. Specifically, 200 µs each is required for reading and for writing 1 page's worth of the data, and 2 ms is required for the erasing the block, therefore close to 30 ms is required in total.

As opposed to this, there is also the technique of preparing in advance a spare erased block 25 and combining the original data of the actual erasure block region 21 and the data after updating pages P0 and P1 in the erased block 25 to perform the writing. In this case, a virtual address structure is used to update the correspondence between the logical addresses and physical addresses in erasure block units, and the physical block corresponding to the logical address to be accessed is pasted from the original erasure block region 21 to the block region 25 to which the data is to be moved. However, in this case as well, the work of caching the valid data from the erasure block region 21 to the destination block region 25 is necessary. Further, at this time, usually the original block region 21 is erased and used for a spare block. Accordingly, in the end, read, write, and erase operations substantially the same as those in the usual case are necessary, so a large overhead is still caused.

Accordingly, the actual transfer performance becomes remarkably low. Under such circumstances, the present-day storage devices using flash memories can only give a transfer performance considerably lower than that of a hard disk drive—particularly at the time of writing.

Further, as explained above, in recent NAND type flash memories, pages in the same erasure block can only be written from lower addresses to upper addresses. The situation becomes even more disadvantageous when the order of write operations in an erasure block is restricted. In a general file system, the write sequence among sectors is not guaranteed. Accordingly, write operations are sometimes carried out from the middle of an erasure block. In that case, even when lower, that is, forward, address regions are empty in that block, data can no longer be written there. As a result, when a write request is issued to one of these regions later, processing the same as rewriting becomes necessary, so the afore-mentioned caching, erasure, and writing of data become necessary.

This not only lowers the transfer performance, but also increases the number of times of erasure of the flash memory and therefore ends up lowering its service life. Further, even when rewriting a huge file, the header is almost located in the middle of the erasure block, therefore data not meant for rewriting existing in the same block must be cached. These operations contribute to latency of file access. The same overhead occurs also for the tail end of a file.

It is therefore desirable to provide a storage device able to reduce the drop in transfer rate and the deterioration of writing and consequently enabling realization of a storage system having a high reliability and high speed.

According to a first aspect of an embodiment of the present invention, there is provided a storage device having a flash memory unit including a plurality of memories which can be accessed in parallel, a page register for acquiring data in parallel from two or more of the plurality of memories and temporarily storing the data, and an address conversion table for managing correspondence between logical addresses and physical addresses in units of data stored in the page register in parallel, the strage device being rewriting data by updating of the address conversion table and additional writing into a storage medium.

Preferably, the unit of data stored in the page register includes a plurality of sectors, and the storage device can access data in units of sectors.

According to a second aspect of an embodiment of the present invention, there is provided a storage device having an address conversion table showing correspondence between logical addresses and physical addresses and a part of storing data according to the address conversion table and rewriting data by updating of the address conversion table and additional writing into a storage medium, wherein the data has a spare region, and that spare region contains the logical address of the data and information indicating an update history of the data.

Preferably, the update history includes a time stamp at the time of writing the data into the storage medium or the number of times of updating of the data in the storage medium.

Preferably, the device has a part of scanning the storage medium and re-constructing the address table based on the logical address and the update history of the spare region.

According to a third aspect of an embodiment of the present invention, there is provided a storage device having an address conversion table showing correspondence between logical addresses and physical addresses, a part of storing data according to the address conversion table and rewriting data by the updating of the address conversion table and additional writing into the storage medium, and a counter, wherein a counter value is updated whenever additional writing on the entire area of the medium or a specific region including a plurality of data, and the counter value or a value unambiguously corresponding to the counter value is written into the spare region of data simultaneously with the data.

According to a fourth aspect of an embodiment of the present invention, there is provided a storage device having an address conversion table showing correspondence between logical addresses and physical addresses, a part of storing data according to the address conversion table and rewriting data by updating of the address conversion table and additional writing into the storage medium, and an address conversion part of converting a logical address input to the device to a first physical address by the address conversion table and further making a defective region on the storage medium non-selectable, wherein at least part of the bits of a first physical address is converted to a second physical address by the address conversion part, and the storage medium is accessed by using the second physical address and the remaining bits of the first physical address.

According to a fifth aspect of an embodiment of the present invention, there is provided a storage device having an address conversion table showing correspondence between logical addresses and physical addresses, a part of storing data according to the address conversion table and rewriting data by updating of the address conversion table and additional writing into the storage medium, a table indicating locations of defective regions and not yet written in regions in the storage medium, and a part of selecting a not yet written in region other than a defective region as a region for the additional writing.

According to a sixth aspect of an embodiment of the present invention, there is provided a storage device comprising a flash memory as a storage medium, a part of storing data according to an address conversion table showing correspondence between logical addresses and physical addresses and rewriting data by updating of the address conversion table and additional writing into the storage medium, and a part of sequentially copying valid data remaining in the first erasure block including a region invalidated by the rewriting to a selectively erased second erasure block and suitably thereafter erasing the first block so as to enable new writing into the invalidated region as recovery processing.

BRIEF DESCRIPTION OF THE DRAWINGS

These and other objects and features of the present invention will become clearer from the following description of the preferred embodiments given with reference to the attached drawings, wherein:

FIGS. 9A and 9B are diagrams showing an example of the configuration of an address conversion table according to the third embodiment of the present invention;

FIGS. 10A to 10C are diagrams showing an address conversion table used for address conversion for compressing the used RAM space;

FIGS. 11A to 11C are diagrams showing an example of compressing the RAM capacity of a spare table;

DESCRIPTION OF THE PREFERRED EMBODIMENTS

Below, preferred embodiments of the present invention will be explained with reference to the drawings.

Figure 3:
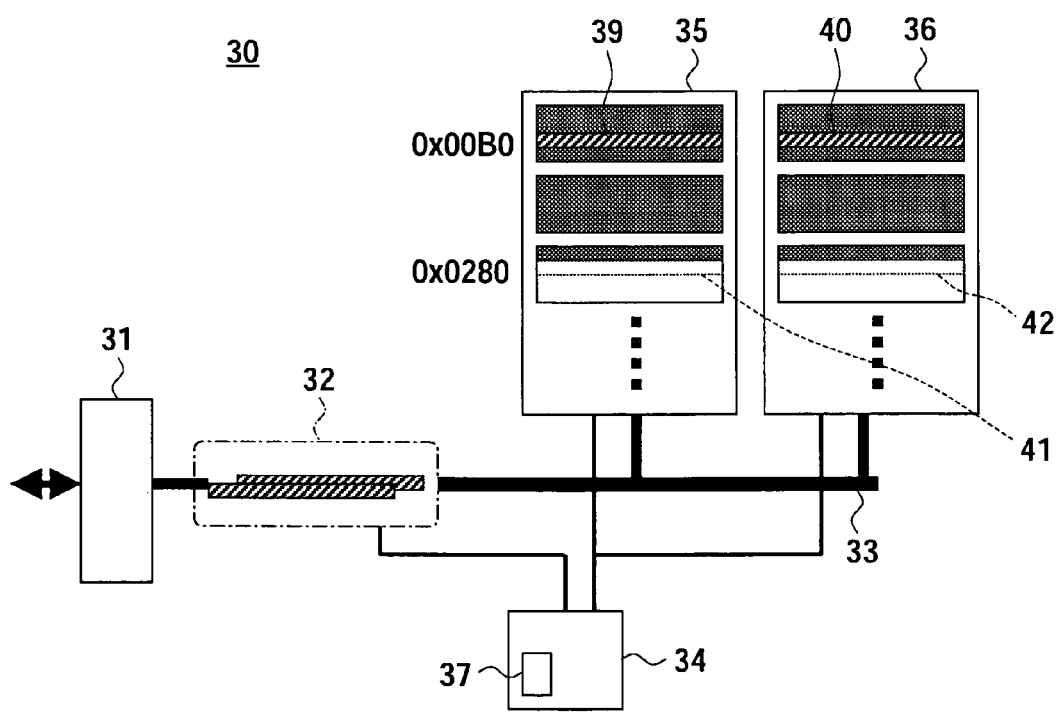
FIG. 3 is a view of a configuration showing a storage device according to a first embodiment of the present invention.

FIG. 3 is a view of a configuration showing a storage device according to a first embodiment of the present invention.

A storage device 30 of FIG. 3 has an interface circuit (I/F) 31, a page buffer 32, an internal data bus 33, a transfer control circuit 34, and NAND type flash memories 35 and 36 as principal components.

Figure 4:
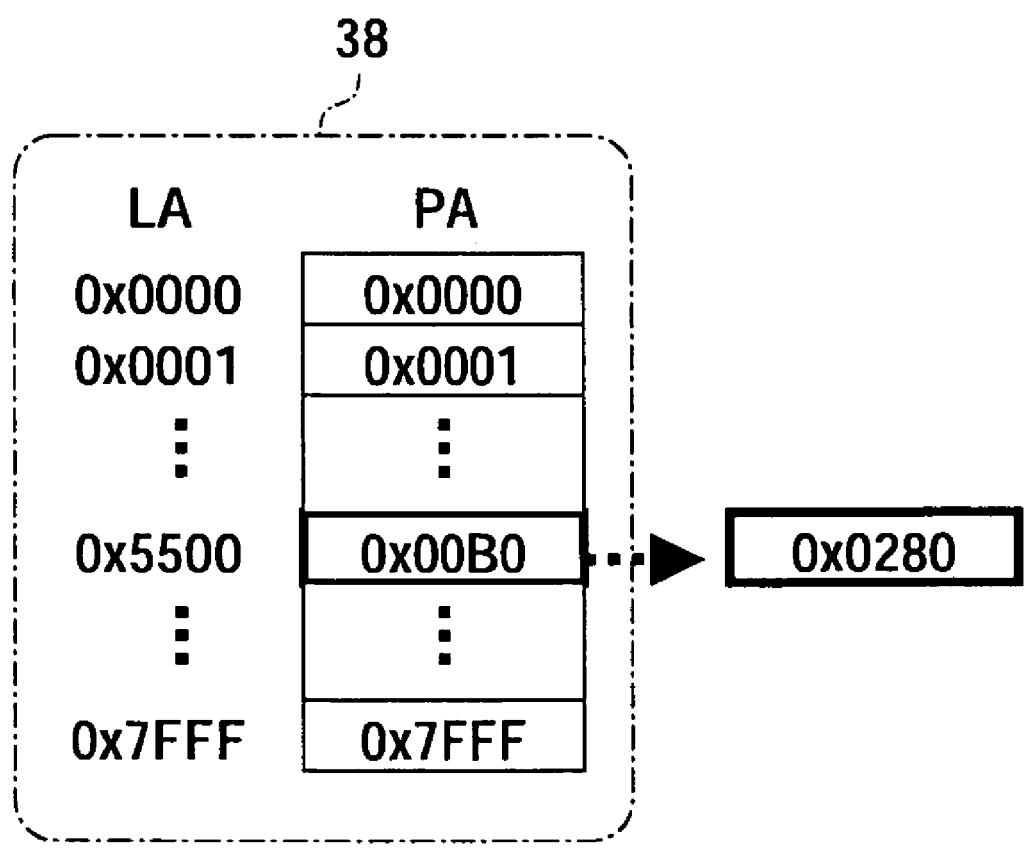
FIG. 4 is a diagram showing an example of the configuration of an address conversion table according to the first embodiment of the present invention.

In the storage device 30, the 32-bit internal data bus 33 has two chips constituted by NAND type flash memories 35 and 36 having 16-bit input/outputs connected to it in parallel. The two NAND type flash memories 35 and 36 are simultaneously accessed in parallel in a read operation and a write operation. The page buffer 32 temporarily stores the accessed page data via the internal data bus 33 and is connected to the interface circuit 31 with the outside. The transfer control circuit 34 manages the transfer between the two flash memories 35 and 36 and the page buffer 32. The transfer control circuit 34 has a built-in RAM 37. The built-in RAM 37 has an address conversion table 38 as shown in FIG. 4 constructed in it.

The storage device 30 is accessed as follows. Here, for simplification, it is assumed that the hexadecimal notation addresses are assigned as follows. For example, when an external input address is "0x5500C", the upper "0x5500" is the page address, and the lower "0xC" is a sector address in the page. The storage device 30 can perform random access in units of 1 sector.

At the time of a read operation, when a sector address of "0x5500C" is input from the outside, the transfer control circuit 34 receives the upper page address to access the built-in RAM 37 and acquires a physical page address (PA: PHYSICAL ADDRESS) "0x00B0" corresponding to the logical page address (LA: LOGICAL ADDRESS) "0x5500" from the address conversion table 38. Both of the memory chips constituted by the NAND type flash memories 35 and 36 are accessed based on this physical address, whereby page data 39 and 40 stored at the page address "0x00B0" are read out from the memories and stored in the page buffer 32. The interface circuit 31 selects a sector corresponding to the lower address "0xC" from among the page data of the page buffer 32 and outputs it to the outside.

On the other hand, when writing data from the outside into "0x5500C", first the page data 39 and 40 are read out from the memory chips constituted by the flash memories 35 and 36 in the same sequence as that for the read operation and are stored in the page buffer 32. After that, the sector corresponding to the lower address "0xC" is selected and updated to the data input from the outside. The updated page data is written back into the flash memories 35 and 36. At that time, the data are written into the empty regions 41 and 42. Further, the physical address corresponding to the logical address "0x5500" of the page table is updated to the address "0x0280" of the empty regions 41 and 42. The thus updated data is written into the suitable empty regions of the flash memories in the form of additional writes. Even if random pages are updated, remapping from the logical addresses to the physical addresses enables continuous writing sequentially from the lower addresses in an erased block.

In the present configuration, the two memory chips constituted by the flash memories 35 and 36 are arranged in parallel, and the page data read out from these are stored in the page buffer 32 all together. At this time, the memory size becomes two times the case where a single chip is used, but the size of a logical page is doubled to cover for this, therefore the number of pages does not increase. Accordingly, the address conversion table 38 does not change, and the size of the RAM 37 for storing the table does not increase.

On the other hand, the weak points of parallel configuration that is, the increase of the number of erasures and the acceleration of rewriting fatigue, are greatly relieved by the additional write type writing using address conversion in units of pages. Namely, the high degree parallel configuration of the flash memories and the additional write type writing by the address conversion in units of pages make up for the other's weak points by combining the two. Then, particularly in a writing step in which the writing time of a memory cell determines the pace, the transfer rate is improved in proportion to the degree of parallelness.

Note that, in the present embodiment, a completely parallel operation was achieved by connecting two 16-bit IO chips to a 32-bit bus, but it is sufficient that the access can be made in a form increasing the effective page size in proportion to the degree of parallelness. A variety of techniques can be considered for the parallel configuration. For example, the two memory chips do not have to exactly simultaneously start the read and write operations. The write operation to the memories includes two processings (work) of a step of transfer of data from the page buffer to the memory chips and a step of writing in the memory chips, but when a for example 16-bit bus is shared by two chips, the transfer is individually carried out. In that case, while data is being transferred from the page buffer to one memory chip, the write operation may be started in the other memory chip. Alternatively, data may be successively transferred to the two, then a write operation simultaneously started. In this way, the technique of offsetting the timings of operation of two chips and making the two operate in parallel is generally seen. The present invention can be applied to even such a case without a problem. Further, for example, a similar effect can be obtained even in a case where 1 chip is configured by 2 banks and where data simultaneously read out from different memory arrays or data simultaneously written into different memory arrays construct one valid page.

Figure 5A:
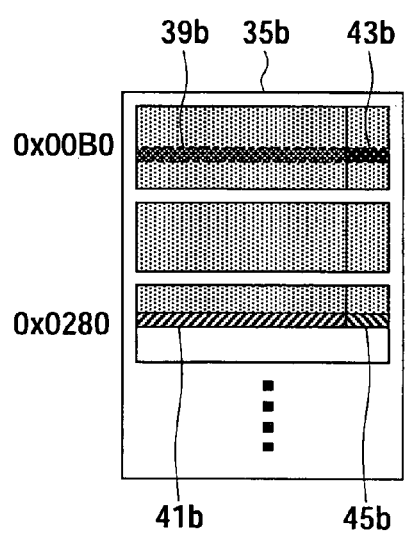
FIGS. 5A and 5B are diagrams for explaining a disadvantage occurring in a case where an additional write type write operation is carried out and a method for dealing with this.
Figure 5B:
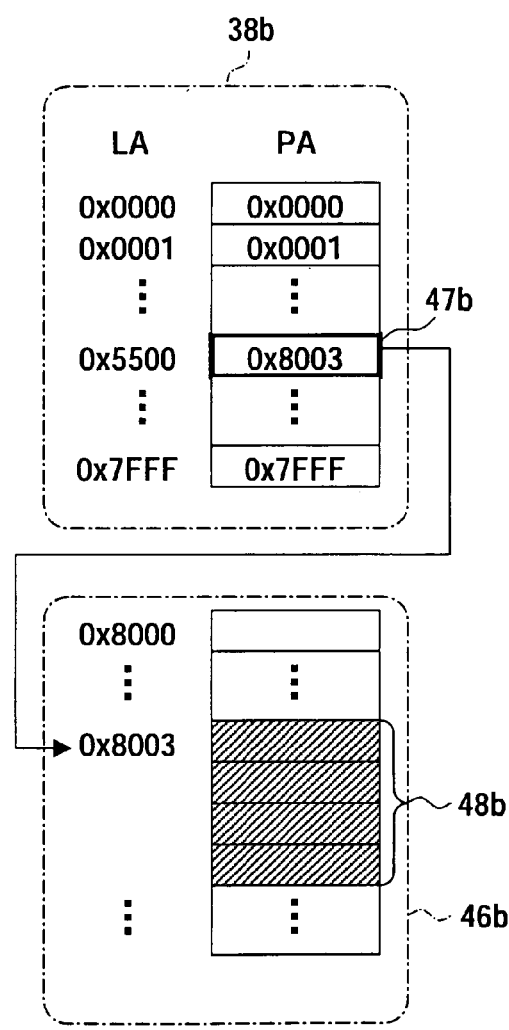

As explained above, many recent flash memories are restricted in sequence of page writing in the same block to writing in order from the lower address. The disadvantage arising in the case where additional write type writing as explained above is carried out under such a restriction and a method for dealing with it will be concretely explained with reference to FIGS. 5A and 5B.

An address conversion table 38b is constructed on the RAM 37, but this ends up being extinguished if the power is down. There is also the method of for example storing the data by providing a dedicated region in a flash memory 35b before that, but if considering momentary power interruptions due to blackouts, this cannot be said to be a failsafe countermeasure. If the address conversion table is lost or corrupted, access itself to the memory becomes completely impossible and the system falls into a critical situation like that of the destruction of the data, therefore its protection is extremely important.

Accordingly, the best countermeasure is to provide a spare region and reflecting the updated content of the table in that whenever writing page data. Specifically, the logical address of that page is entered. Due to this, it is possible to scan the stored data of the chip constituted by the flash memory 35b from the upper (physical) address at the time of turning on of the power so as to clarify the correspondence between the physical addresses and the logical addresses and reconstruct the address conversion table. Assume here that the logical page "0x5500" is updated, the original page data 39b is updated, and the updated data is written into an empty region 41b. At this time, the logical page address "0x5500" is already entered in a spare region 43b of the page data 39b, so the same logical address "0x5500" is also entered into a spare region 45b of the empty region 41b.

Note that when the writing sequence of pages in the same block is stipulated in the above way, even if there is a not yet written into spare region in the page 39b, writing soon becomes impossible. Namely, there is no means for later marking updated and invalidated original pages. This being the case, valid data and invalid data cannot be distinguished at the point of time of scanning for reconstructing the table, therefore a plurality of the same logical addresses will appear, and a correct address conversion table can no longer be constructed.

Therefore, in the present embodiment, at the time of writing each page data, an update history for distinguishing which data is the newest is described together with the logical address in that spare region. For example, a time stamp of the time of the update or a cumulative number of updates corresponding to the logical address is described. Note that, concerning the cumulative number of updates, it is sufficient for example to provide the memory with a counter for holding the cumulative number of updates at all logical addresses or the cumulative number of updates for each of the divided logical addresses, increment the counter value corresponding to the time of the writing of each page data, and describe the result in the spare region. Further, when the page write sequence in a block is stipulated, since the relative ages of the pages in the same block are unambiguously determined, the counter value may be incremented only at the time when the block to be written in changes, and this made the cumulative number of updates. At the time of reconstructing the address conversion table, the correspondence between the newest logical address and physical address is reflected in the table with reference to that history.

The table may be specifically reconstructed for example in the following way in order to save the memory space. A spare table region (spare table) 46b is provided in the same memory together with the address conversion table 38b. The correspondence between the logical addresses and physical addresses is reflected into the address conversion table 38b whenever the physical addresses of the flash memory 35b are scanned to read out the page data and acquire the logical addresses. According to the above example, at this time, when for example the page of "0x00B0" of the flash memory 35b is read out, the logical address "0x5500" is acquired, therefore first "0x00B0" is described in a field 47b of the physical address corresponding to the logical address of "0x5500". Further, continuing the sequential scanning, when the page of "0x0280" is read out, the same logical address "0x5500" is acquired, but "0x00B0" has been already written in the physical address field 47b corresponding to "0x5500". When an overlap of a physical address is detected in this way, a storage region 48b is secured in the spare table 46b, and the value of the physical address field 47b is rewritten to the index of the storage region 48b in the spare table 46b.

When the storage region is generally secured with respect to logical addresses with which physical addresses overlap in this way, the physical addresses of the flash memory 35b are scanned from the first again. When the page of "0x00B0" is read out again in this way, the logical address "0x5500" is acquired, but the field 47b of that physical address stores the index to the storage region 48b on the spare table 46b. Therefore, the physical address "0x00B0" and the above history data are written into the storage region 48b. When the sequential scanning is further continued and the page of "0x0280" is read out, the same logical address "0x5500" is acquired, and the index to the storage region 48b is acquired in the same way. The history data described here is compared with its own history data. When its own history is newer, the physical address and the history data are rewritten.

When the second scanning ends in this way, the newest physical address is stored in the spare table 46b. After that, the address conversion table 38b is scanned from the top. When there is an index to the spare table 46b in the field of the physical address, that value is replaced by the physical address stored at the destination of the index. After passing through the above steps, the complete address conversion table is reconstructed. Such a method secures memory for storing history data only for logical page addresses overlapping with physical addresses, therefore the amount of use of the RAM for the address conversion table can be reduced.

The management of defects is also important in a large size flash memory. In the case of for example a flash memory, when there is a defect, for example, gate destruction in one memory cell, this degrades the reliability of the entire erasure block in many cases. Accordingly, defects are usually managed in units of erasure blocks. Erasure blocks including defect cells are replaced with spare blocks. This replacement is sometimes dynamically carried out after shipping by detecting defects at the time of error correction. Further, simultaneously, such block management is used also for averaging the number of erasures. Countermeasures such as replacement of data between blocks having a large number of rewrites and blocks having a small number of rewrites are also taken in some cases.

An embodiment achieving both such memory management in units of erasure blocks in this way and this memory management in units of pages will be explained next with reference to FIG. 6.

Figure 6:
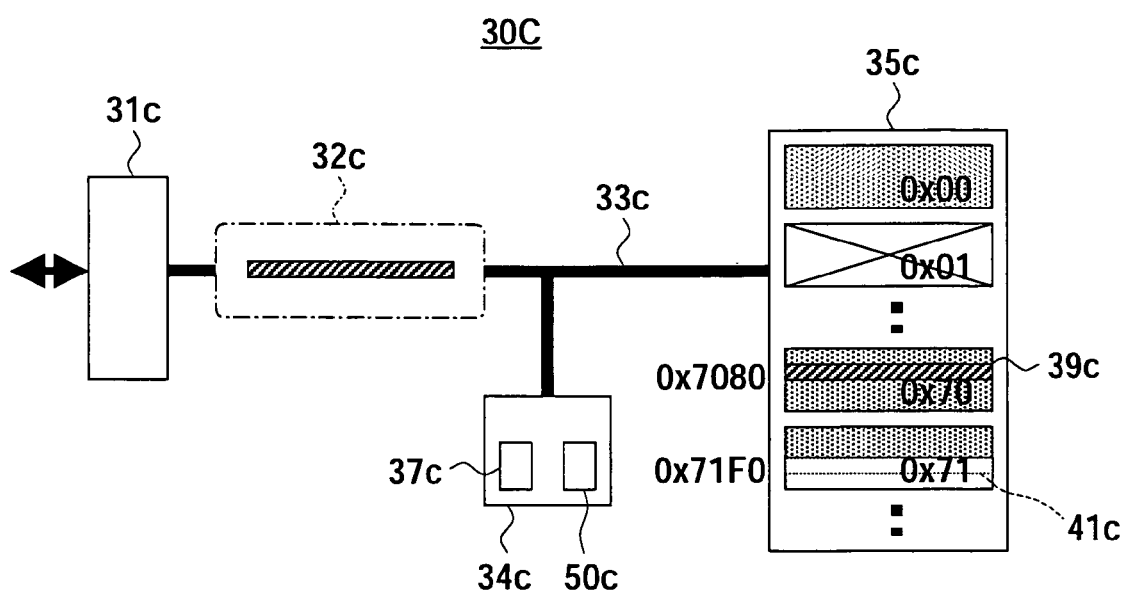
FIG. 6 is a view of the configuration showing a storage device according to a second embodiment of the present invention.
Figure 7A:
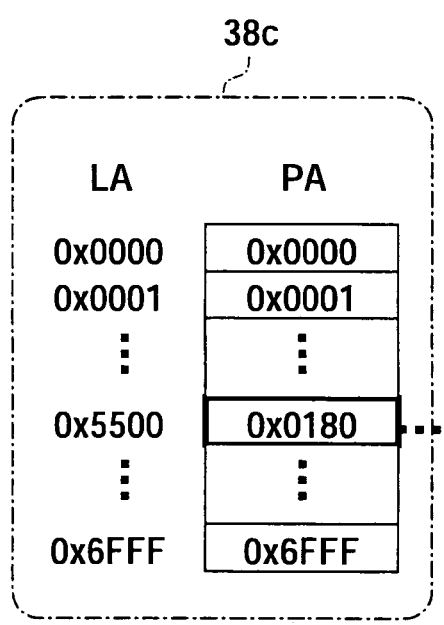
FIGS. 7A and 7B are diagrams showing an example of the configuration of an address conversion table according to the second embodiment of the present invention.
Figure 7B:
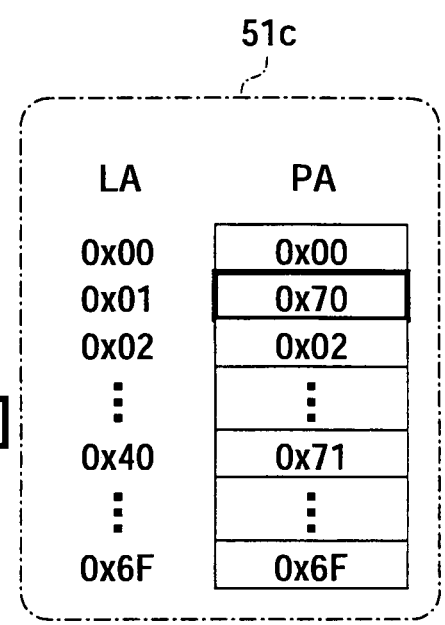

FIG. 6 is a view of a configuration showing a storage device according to a second embodiment of the present invention. FIGS. 7A and 7B are diagrams showing an example of the configuration of the address conversion table in a transfer control circuit according to the second embodiment of the present invention.

The basic configuration of a storage device 30C according to the present second embodiment is close to one of the flash memories in the first embodiment formed in one chip, but in a transfer control circuit 34c, in addition to a RAM 37c configuring an address conversion table 38c of page addresses, a RAM 50c configuring an address conversion table 51c in units of erasure blocks is mounted. The address conversion table 51c prevents access to blocks including defects by replacing these with normal blocks when linking logical addresses and physical addresses.

The storage device 30C is accessed as follows. At the time of a read operation, when for example the sector address of "0x5500C" is input from the outside, the transfer control circuit 34c receives the upper page address "0x5500", accesses the built-in RAM 37c, and acquires a physical page address PPA "0x0180" corresponding to the logical page address LPA from the address conversion table 38c. In this physical address, the upper "0x01" is the address corresponding to the erasure block. This value is converted again by the address conversion table 51c, whereby a physical block address PBA "0x70" is acquired. The actual flash memory 35c combines the lower physical page address "0x80" obtained from the address conversion table 38c and the physical block address "0x70" obtained from the address conversion table 51c, accesses the page region 39c corresponding to the physical address "0x7080" on the memory, and stored this in the page buffer 32c. The interface circuit 31c selects the sector corresponding to the lower address "0xC" from among this and outputs the same to the outside.

On the other hand, when writing data into "0x5500C" from the outside, first the same routine as the read operation is used to read out the page data 39c from the memory chip constituted by the flash memory 35c and store it in the page buffer 32c. Thereafter, the sector corresponding to the lower address "0xC" is selected and updated to the data input from the outside. The updated page data is written back into the flash memory 35c. At that time, the physical address corresponding to each logical address of the address conversion table 51c is referred to and any empty region in that block is searched for. For example, assume that, at a logical address LBA "0x40", there is a suitable empty region 41c in the block of the corresponding physical address PBA "0x71", and the page address on that memory is "0x71F0". At this time, the page data is written into the empty region 41c, and the physical address (PPA) corresponding to the logical address LPA "0x5500" of the page table is updated to "0x40F0".

Figure 8:
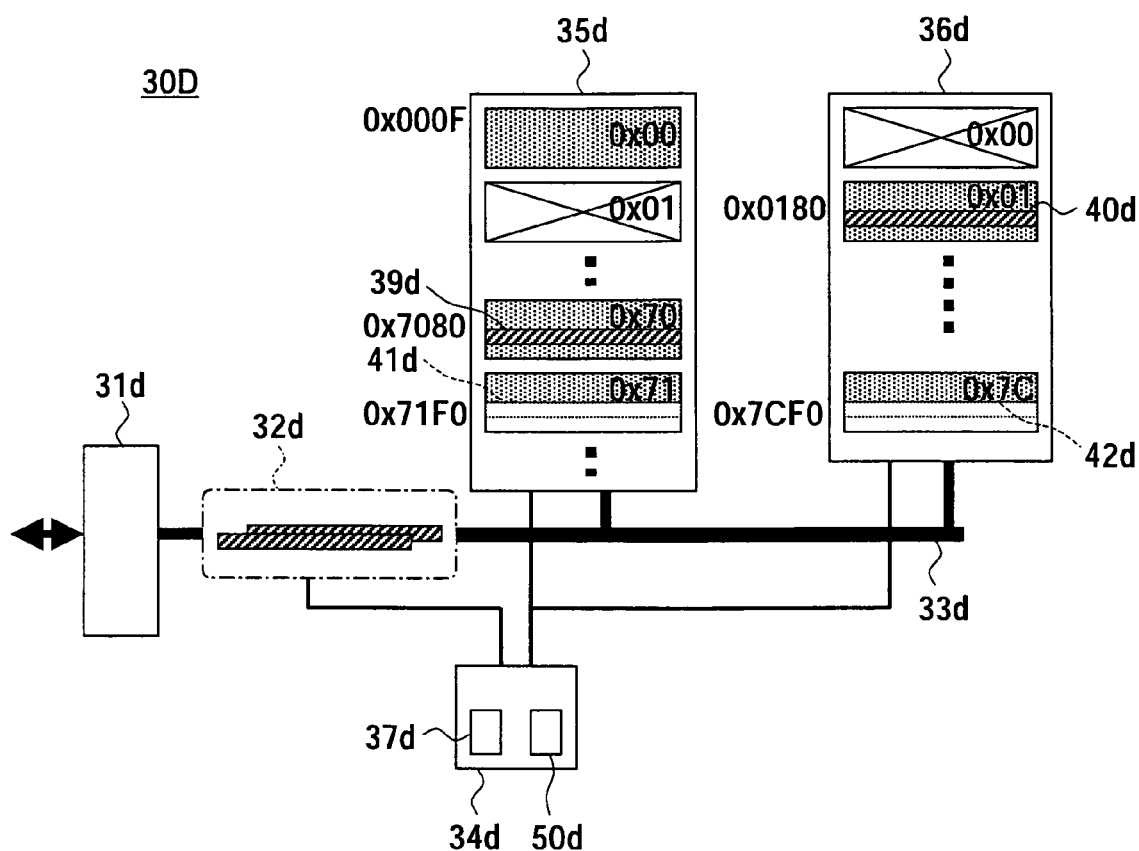
FIG. 8 is a view of the configuration showing a storage device according to a third embodiment of the present invention.

Such hierarchical arrangement of virtual addresses makes flexible management possible even for a parallel configuration of a plurality of chips or a plurality of banks. FIG. 8 shows a third embodiment using two chips configured in parallel.

FIG. 8 is a view of a configuration showing a storage device according to a third embodiment of the present invention. FIGS. 9A and 9B are diagrams showing an example of the configuration of the address conversion table in the transfer control circuit according to the third embodiment of the present invention.

In a storage device 30D according to the third embodiment, two chips of flash memories of the second embodiment are arranged in parallel. Physical address fields PBA0 and PBA1 in the erasure block unit address conversion table 51d are independently arranged for the chips of the flash memories 35d and 36d. Namely, in a RAM 50d built-in the transfer control circuit 34d, substantially two sets of erasure block unit address conversion tables are configured.

The storage device is accessed as follows. At the time of a read operation, when for example the sector address of "0x5500C" is input from the outside, the transfer control circuit 34d receives the upper page address "0x5500", accesses the built-in RAM 37d, and acquires the physical page address PPA "0x0180" corresponding to the logical page address LPA from the address conversion table 38d. The upper "0x01" in this physical address is the address for the erasure block. This value is converted again by the address conversion table 51d, whereby the physical block address PBA0 "0x70" with respect to the memory chip constituted by the flash memory 35d and the physical block address PBA1 "0x01" with respect to the flash memory 36d are acquired. For the actual flash memory 35d, the lower physical page address "0x80" obtained from the address conversion table 38d and the physical block address "0x70" obtained from the PBA0 field of the address conversion table 51d are combined, and the page region 39d corresponding to the physical address "0x7080" on the memory is accessed. For the flash memory 36d, the lower physical page address "0x80" obtained from the address conversion table 38d and the physical block address "0x01 obtained from the PBA1 field of the address conversion table 51d are combined, and the page region 40d corresponding to the physical address "0x0180" on the memory is accessed. The page data read out from both are stored in the page buffer 32d all together. The interface circuit 31d selects the sector corresponding to the lower address "0xC" from among those and outputs the same to the outside.

On the other hand, when writing data into "0x5500d" from the outside, first, a similar routine as the read operation is used to read out the page data 39d and 40d from the memory chips constituted by the flash memories 35d and 36d and store them in the page buffer 32d all together. Thereafter, the sector corresponding to the lower address "0xC" is selected and updated to the data input from the outside. The updated page data is written back into the flash memories 35d and 36d. At that time, the physical address corresponding to each logical address of the address conversion table 51d is referred to and any empty region in that block is searched for. For example, assume that there is an empty region 41d in the block of the physical address PBA0 "0x71" on the flash memory 35d and an empty region 42d in the block of the physical address PBA1 "0x7C" on the flash memory 36d corresponding to the logical address LBA "0x40" and that the page addresses on the memories are "0x71F0" and "0x7CF0". At this time, the page data are written into the empty regions 41d and 42d, and the physical address PPA corresponding to the logical address LPA "0x5500" of the address conversion table 38d is updated to "0x40F0".

In the present embodiment, by employing the erasure block unit address conversion table 51d having independent physical address fields, defect management of the flash memories 35d and 36d can be performed completely independently. On the other hand, these are handled in the same way as with a single chip from the page unit address conversion table 38d. In this way, hierarchical arrangement of the virtual addresses in the present embodiment enables independent complex defect management for each chip in an additional write type storage device.

The address conversion table 51d was used for the address conversion at the block level in the above embodiments of the present invention. However, when using such a correspondence table, it is necessary to provide a physical address field for each chip. This puts pressure on the RAM space. To deal with this, an example of address conversion for compressing the used RAM space is shown. The hardware configuration is assumed to be similar to that in FIG. 8.

FIGS. 10A to 10C are diagrams showing an address conversion table used for address conversion for compressing the used RAM space.

An address conversion table 38g stored in the RAM 37d is the same as that of the third embodiment of the present invention. However, smaller sized tables 51g and 52g are stored in the RAM 50d. In the present example, the logical block addresses LBA are tacitly assigned physical block addresses "0x00" to "0x6F" having the same values in advance for. On the other hand, regions of the physical block addresses "0x70" to "0x7F" are assigned to spare blocks. The block table "51g" is provided with only 1-bit defect flags DEF and 5-bit spare index fields SID for storing the index of the spare table. On the other hand, the spare table 52g stores defect flags DEF0 and DEF1 and spare offsets SOF0 and SOF1 for each flash chip corresponding to the spare indexes of the spare index fields SID.

For example, assume that the logical page address LPA "0x5500" is accessed from the outside, and the physical page address PPA "0x0180" is acquired from the address conversion table 38g. In this physical address, the upper "0x01" is the logical address corresponding to the erasure block. In the table 51g, the defect flag is set at the block address LBA "0x01", and "10" is recorded in the spare index field SID. When referring to the spare table 52g, it is understood that there is no defect in the chip 35d, and the defect block should be replaced with the spare block corresponding to the spare offset SOF1 "0x4" in the chip 36d. Accordingly, the converted physical block address is judged to be the same "0x01" as the logical address in the chip 35d while is judged as "0x74" from the spare group for the chip 36d. These are combined with the lower address "80" of the page, whereby corresponding pages "0x0180" and "0x7480" in the flash memories are accessed.

In the table 51d in the third embodiment, 7-bit fields were provided for storing the physical addresses of the flash chips for the 112 logical blocks. Accordingly, a memory space of at least 7×2×112 to 1.57 k bits is inherently required, but the table 51g uses only 6 bits for logical addresses and the table 52g uses only 10 bits for 32 spare blocks, therefore 6×112+ 10×32 to 0.99 k bits is sufficient even in total. Accordingly, the used RAM space can be compressed.

In this way, there are many possible variations in the technique for conversion for avoiding defect blocks. In each case, however, first the address conversion table is used for address conversion in units of pages, then conversion for avoiding defects is applied to some bits and the converted values are combined with the remaining bits to access a flash memory. Due to this, it becomes possible to flexibly achieve both writing in units of pages and defect management in units of blocks.

Further, an example of compressing the RAM space of the spare table of the above embodiment is shown in FIGS. 11A to 11C.

For example, when the number of chips increases from the two in the embodiment of FIGS. 10A to 10C to four, the rows of the spare table 52g of FIG. 10C are increased by the same number of fields in the lateral direction. On the other hand, the total number of blocks including defects may become two times greater at the maximum, so the SID also becomes two times greater, and the range becomes 0x00 to 0x3F. In this way, when the number of used chips is increased N times, the RAM space used by the spare table 52g swells to a square of N.

To deal with this, a spare table 52i of the embodiment of FIG. 11C defines a plurality of replacement blocks corresponding to the same logical block addresses LBA vertically stacked. The "Last" field indicates the tail end of the definition, and the "Chip" field indicates a chip address for the replacement. In the table 51i, a defect flag is set at the block address LBA "0x01", and "0x00" is recorded in the spare index field SID. Therefore, when referring to the spare table 52i, it is understood that in both chips "0x0" and "0x2", defect blocks are replaced with spare blocks corresponding to the spare offsets SOF "0x0". Further, in the table 51i, a defect flag is set at the block address LBA "0x6E", and "0x1F" is recorded in the spare index field SID. Therefore, when referring to the spare table 52i, it is seen that in the chips "0x1", "0x2", and "0x3", defect blocks must be replaced with spare blocks corresponding to the spare offsets SOF "0x6", "0xA", and "0x4". In the present example, the SID of the spare table 52i covers the total number of defects, therefore the range is 0x00 to 0x3F and increases in the same way as the above embodiment. However, the increase of the number of bits in the row direction can be greatly reduced, so the RAM size required for the spare table can be compressed.

Another technique not involving multiple conversion as explained above is shown next. For simplification, the hardware configuration is assumed to be the same as that in FIGS. 7A and 7B.

Figure 12A:
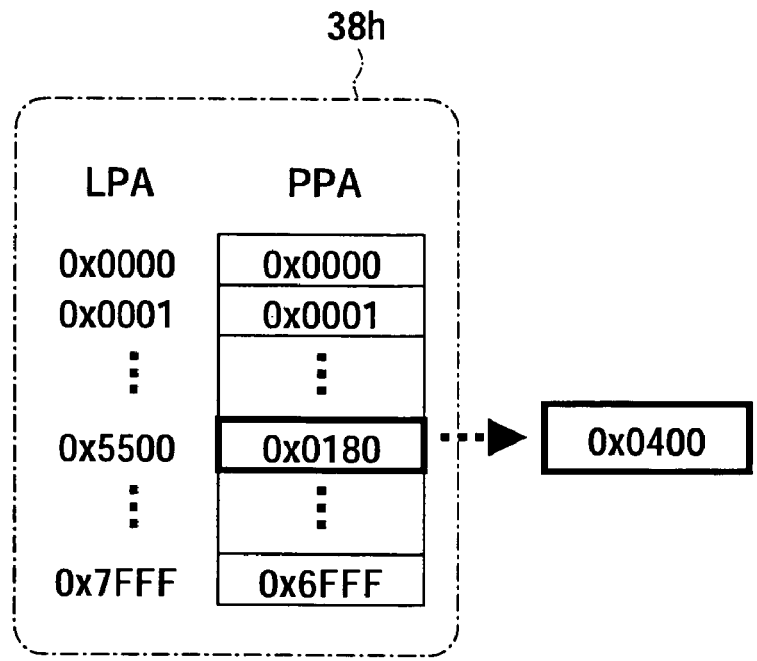
FIGS. 12A and 12C are diagrams showing another example of an address conversion table used for address conversion for compressing the used RAM space.
Figure 12B:
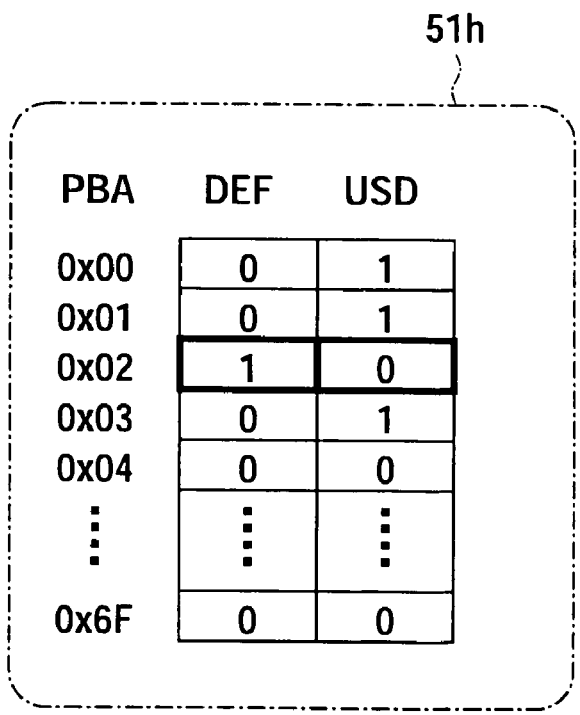
Figure 12C:
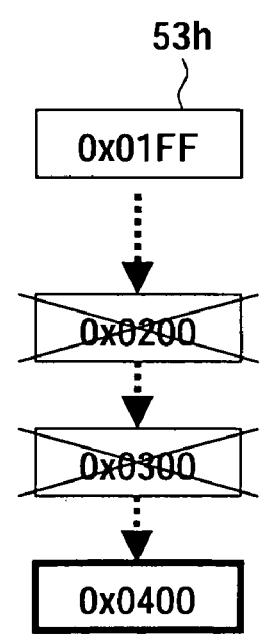

FIGS. 12A to 12C are diagrams showing another example of the address conversion table used for address conversion for compressing the used RAM space.

An address conversion table 38h stored in a RAM 37c is the same as that of the second embodiment of the present invention. Note that a RAM 50c stores a table 51h indicating the state of defects for each physical block address PBA and the state of usage of the blocks. The defect flag DEF indicates a defect in the target block. On the other hand, the usage flag USD becomes "0" after erasing the block and becomes "1" when data is written into even one portion. Further, a write pointer indicating the previously written page address is stored in a register 53h. The usual write operation is executed in a form of incrementing the pointer. Namely, in the same block, the data are sequentially written from the page address "0x00" toward "0xFF".

In the present embodiment, when writing in a flash memory, the physical page address for the writing is determined from the table 51h and the register 53h. At this time, any defect block from which defect information is detected is skipped, whereby pages in the defect block are not written in. Accordingly, access to a defect block can be avoided without converting the erasure block address.

For example, assume updating a portion of the logical page address "0x5500". At this time, first the data is read to the page buffer, but the flash chip 35c may also be directly accessed at the physical page address "0x0180" obtained from the address conversion table 38h. The data read out in this way and updated in the page buffer is written into an empty region of the flash memory 35c by the following routine.

1. The pointer value "0x01FF" of the register 53h indicates the physical address of the page written immediately before this. It is seen that this is the page of the tail end of the block "0x01", and this block is fully written. Accordingly, the system scans the table 53h while incrementing the block address to search for the next writing block.

2. The DEF of the block of the next address "0x02" is "1" indicating that the block is a defect block. Therefore, this block is skipped.

3. The USD of the block of the next address "0x03" is "1" indicating that the block is an already used block. Therefore, this block is skipped.

4. The block of the next address "0x04" is an already erased good block. Accordingly, the pointer value of the register 53h is set at the header page address "0x0400" and the data is written there after updating.

5. The physical address field corresponding to the logical page address "0x5500" of the address table 38h is updated to "0x0400".

Namely, the present embodiment provides a table describing the defects of blocks and empty information for corresponding physical block addresses and provides a function of referring to the table described above and avoiding defect blocks when selecting a page for writing at the point of time of writing into the flash memory. Accordingly, the address fields of the physical pages in the address conversion table 38h never include pages in a defect block, so it is not necessary to convert block addresses.

Note that the above embodiments were all explained with reference to flash memories as examples, but these additional write type storage systems can also be applied to EPROMs, OTPs, etc. where data cannot be electrically erased. In addition, it is possible to apply the present invention to all memories where data cannot be random rewritten in unit of bytes.

In additional write type storage system, the data regions in the past remaining after the updating become invalid. Particularly in the flash memory, the recovery processing of these in unit of erasure blocks is executed, and they are converted to the write enable empty regions. Particularly in the case where the writing sequence in the erasure block is restricted, an adequate recovery routine thereof is shown in FIG. 13 as a fourth embodiment of the present invention.

Figure 13:
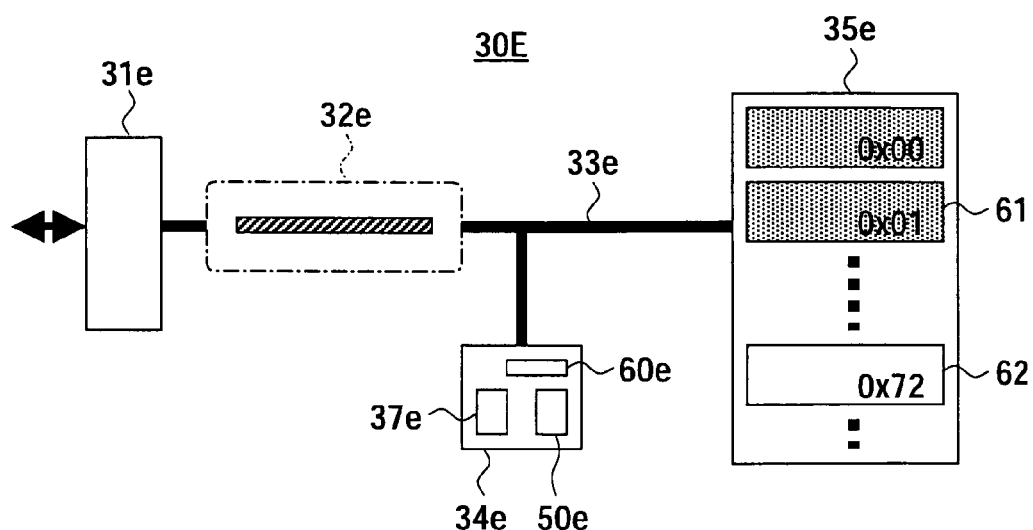
FIG. 13 is a view of the configuration showing a storage device according to a fourth embodiment of the present invention.
Figure 14A:
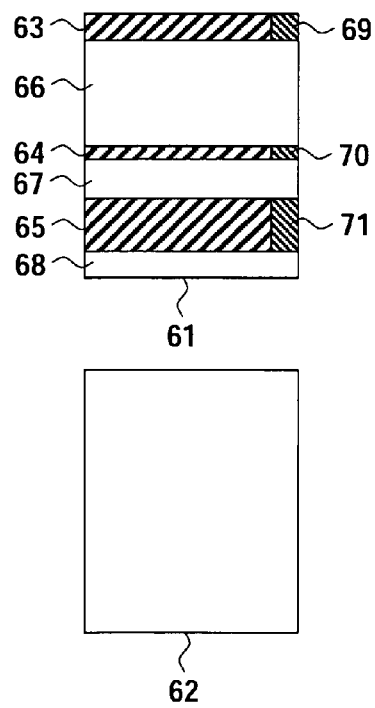
FIGS. 14A to 14C are diagrams for explaining data processing inside an erasure block according to the fourth embodiment of the present invention.
Figure 14B:
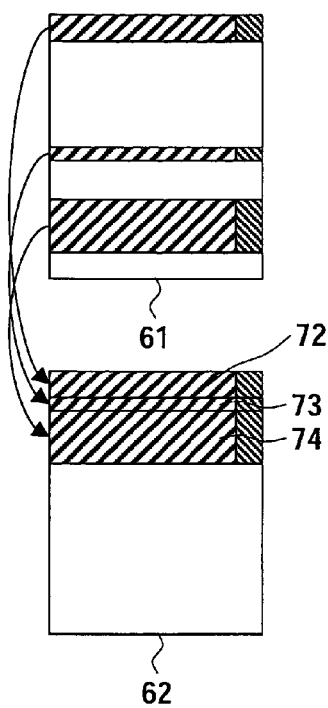
Figure 14C:
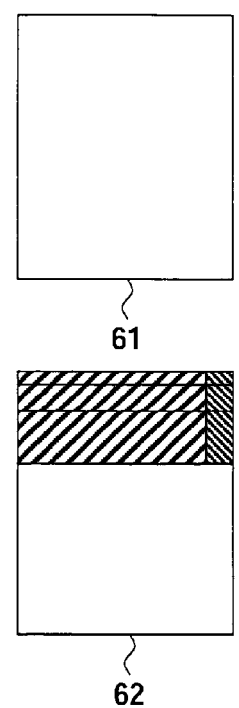

FIG. 13 is a view of a configuration showing a storage device according to a fourth embodiment of the present invention. FIGS. 14A to 14C are diagrams showing the routine for processing data inside an erasure block in the fourth embodiment of the present invention.

The configuration of a storage device 30E according to the fourth embodiment is basically the same as the second embodiment of the present invention. In a transfer control circuit 34e, however, in addition to the RAMs 37e and 50e for the page address table and the block address table, a register 60 for temporarily storing a page address updating portion explained later is provided. As this, a part of the already existing RAM region may be used. Here, assume an erasure block 61 in a flash memory 35e is processed to restore invalid regions. At this time, a spare erased block 62 is simultaneously used.

Here, the data processing inside the erasure blocks 61 and 62 according to the fourth embodiment will be explained with reference to FIGS. 14A, 14B, and 14C.

As shown in FIG. 14A, in the erasure block 61, regions 66, 67, and 68 invalidated by updating after data are once written coexist with the valid page data 63, 64, and 65. Here, it is necessary to restore the invalid regions to empty areas while leaving the valid page data. Spare regions 69, 70, and 71 are provided in the page data 63, 64, and 65, and the logical addresses of the pages are stored there. On the other hand, the spare block 62 is in the already erased empty state.

Figure 1:
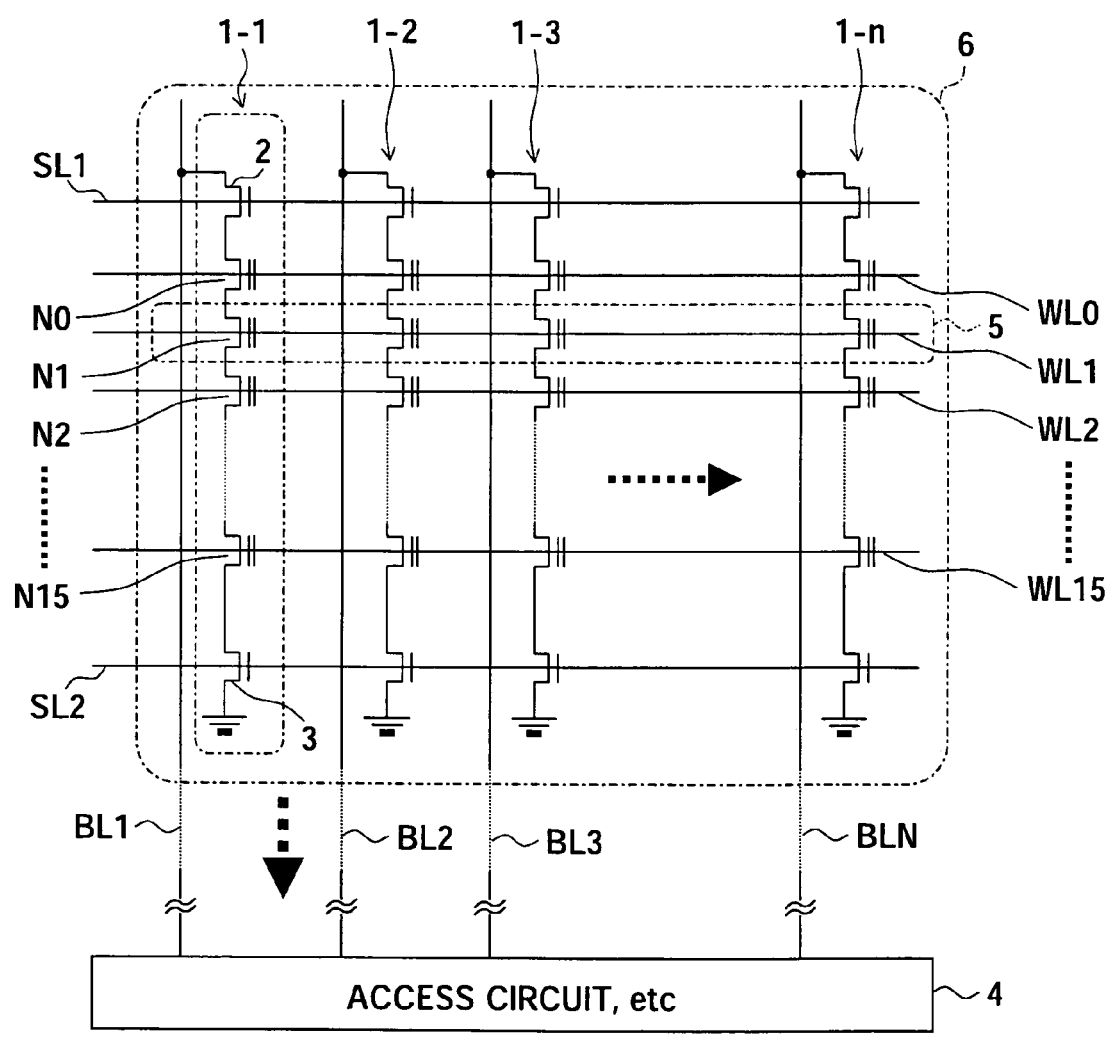
FIG. 1 is a diagram showing an example of the configuration of an internal portion of a NAND type flash memory.
Figure 2:
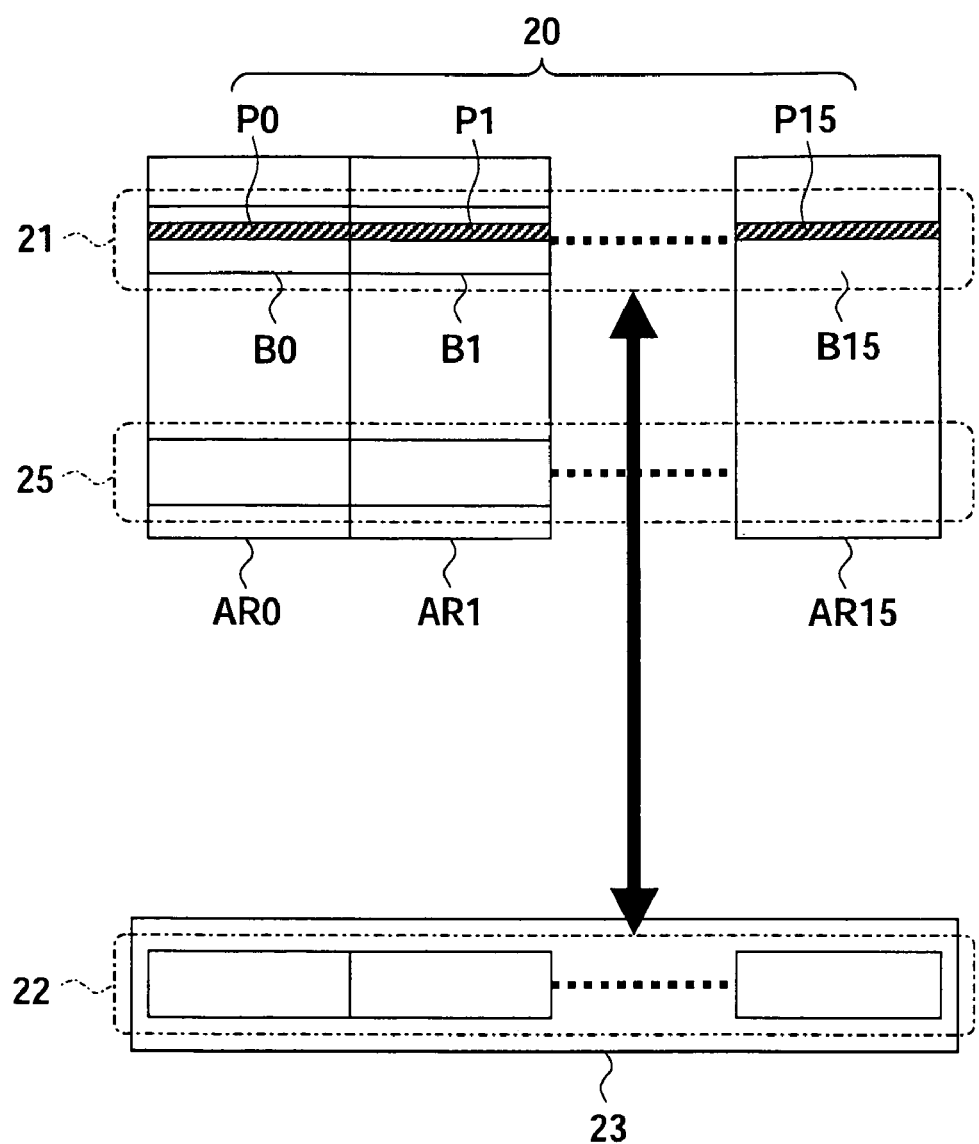
FIG. 2 is a diagram showing a conceptual view of a flash memory configuring a storage device.

As shown in FIG. 14B, the valid page data 63, 64, and 65 are sequentially copied to empty regions 72, 73, and 74 in the spare block 62. Further, the correspondence between the logical addresses of pages described in the spare regions 69, 70, and 71 and physical addresses of newly copied regions is stored in the register 60. At this time, the data of the invalid regions 66, 67, and 68 are not copied. Only the above valid page data are copied to the spare block 62 filling it to the top. Such a selective copy operation is remarkably different from the general copy operation shown in FIG. 2 and is accompanied by a change of relative locations of pages in the block.

As shown in FIG. 14C, the block address table 50e is updated, the original erasure block 61 is replaced by the spare block 62, and the block 61 is erased as the spare block. Further, based on the value of the register 60, the page table (address conversion table) 38e of the RAM 37e is updated.

Figure 15A:
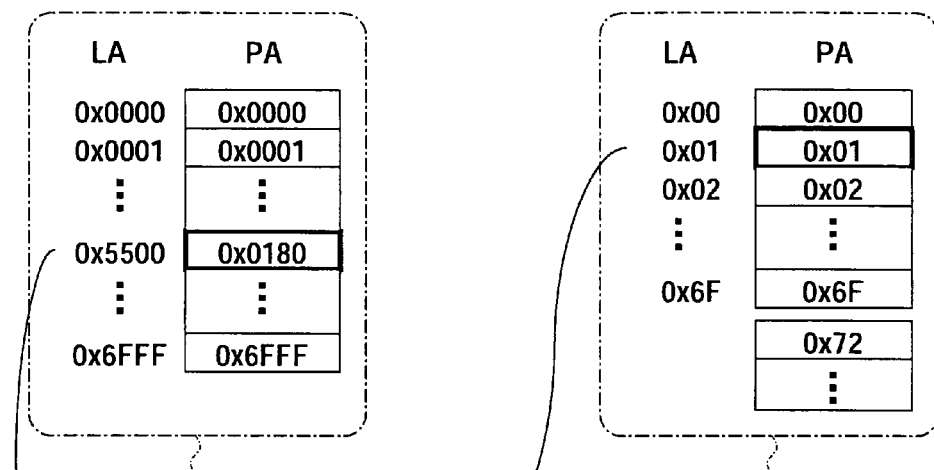
FIGS. 15A to 15C are diagrams for explaining a concrete example of updating an address conversion table in the fourth embodiment of the present invention.
Figure 15B:
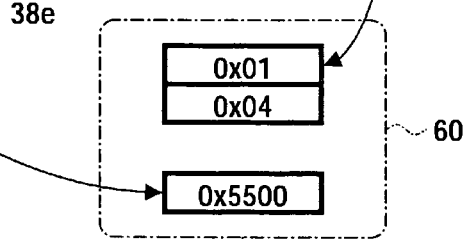
Figure 15C:
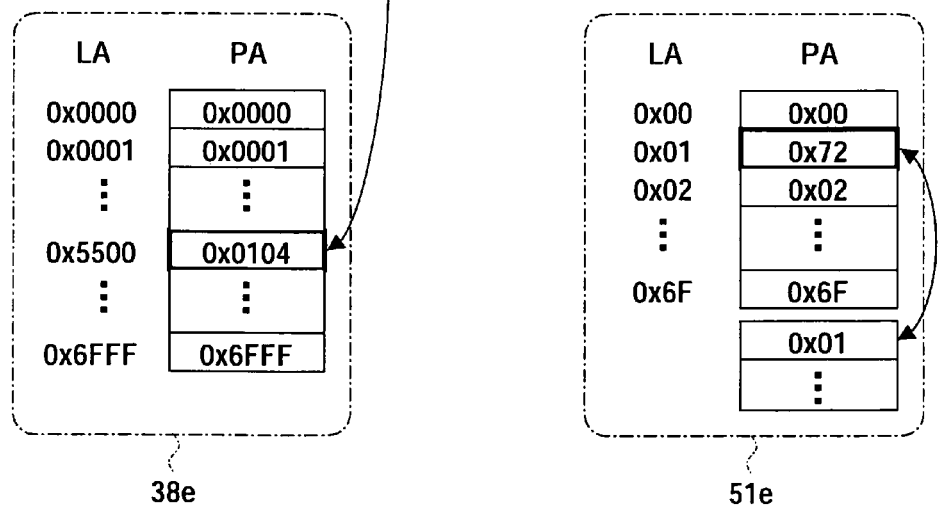

A concrete example of the updating of an address conversion table accompanying the above routine is shown in FIGS. 15A, 15B, and 15C. Assume that the logical page address of the valid page data 64 (FIGS. 14A to 14C) is "0x5500". This value is described in the spare region 70 (FIGS. 14A to 14C). Below, the transition of this data will be explained.

As shown in FIG. 15A, from the address conversion table 38e, the physical page address corresponding to the logical page address "0x5500" becomes "0x0180". The erasure block address "0x01" thereof remains the same "0x01" even after further conversion at the address conversion table 51e. Namely, the page data 64 (FIGS. 14A to 14C) corresponding to the logical address "0x5500" is stored in the page region 64 corresponding to the physical address "0x80" in the erasure block 61 of the physical address "0x01".

Assume that the above data is copied to the page 73 (FIGS. 14A to 14C) corresponding to the physical address "0x04" in the spare block 62 (FIGS. 14A to 14C) corresponding to the physical address "0x72". At this time, the following correspondence is stored in the register 60 as shown in FIG. 15B.

Logical block address "0x01" accessed by using the table at present.
Physical page address "0x04" of a region 73 (FIGS. 14A to 14C) as the new destination of storage of the copy data.
The logical page address "0x5500" stored in the spare region 70 (FIGS. 14A to 14C).

As shown in FIG. 15C, the page address conversion table 38e is updated by reflecting the correspondence of the above register 60, and the physical page address corresponding to the logical page address "0x5500" is rewritten to "0x0104". Further, along with the switch between the spare block 62 (FIGS. 14A to 14C) and the original block 61 (FIGS. 14A to 14C), the block address conversion table 51e is updated, and the physical block address corresponding to the logical block address "0x01" is rewritten to "0x72".

After the table is updated by such a routine, first, with respect to a logical page address "0x5500" input from the outside, first the physical page address "0x0104" is acquired at the address conversion table 38e, then the physical block address "0x72" with respect to the upper address "0x01" is acquired at the address conversion table 51e. Due to this, it becomes possible to correctly access the new region 73 (FIGS. 14A to 14C).

Namely, when moving valid data along with the recovery processing of invalid data, a logical page address described in the spare region is temporarily stored in the register. By reflecting this value in the page address conversion table, it is possible to suitably handle even changes in sequence of data storage positions in a block.

As explained above, according to the present embodiment, when using for example a flash memory as a storage medium, a storage system having a high reliability and high speed can be realized. According to the present embodiment, further, it is possible to greatly reduce the degradation of the transfer rate and deterioration of writing accompanying erasure in units of blocks and the restriction of the data writing sequence in the blocks. Further, defect blocks can be flexibly replaced while obtaining such an improvement in performance, and regions invalidated in a flash memory can be suitably restored.

A storage device according to a fifth embodiment of the present invention will be explained next.

Figure 16:
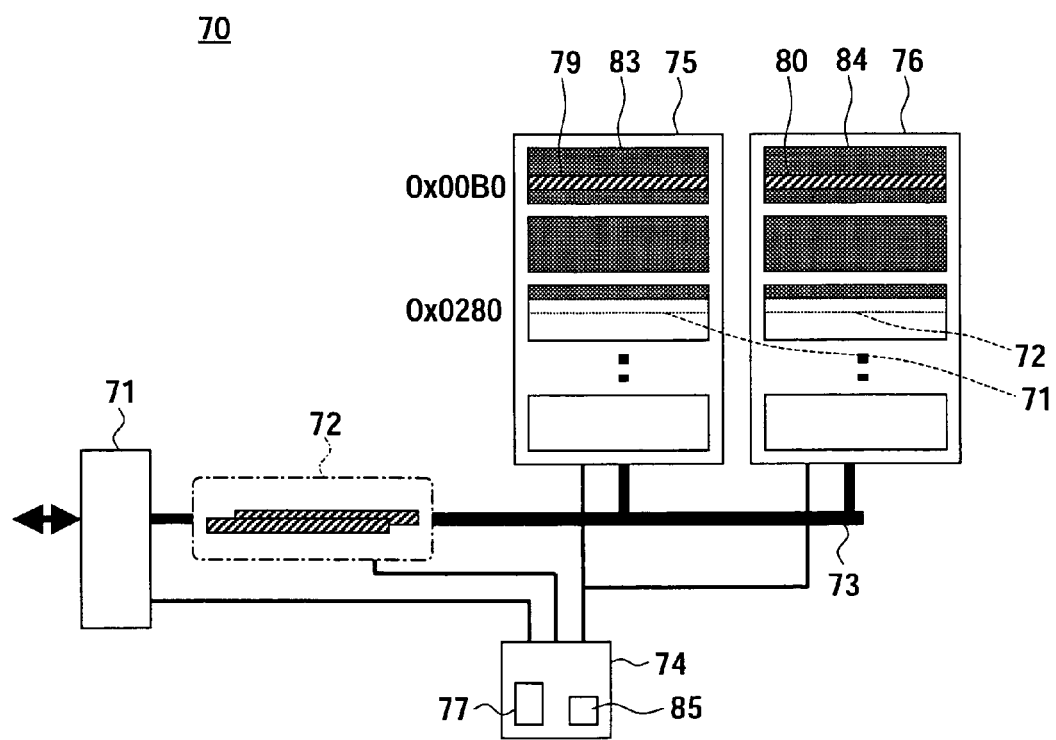
FIG. 16 is a view of the configuration showing a storage device according to a fifth embodiment of the present invention.
Figure 17A:
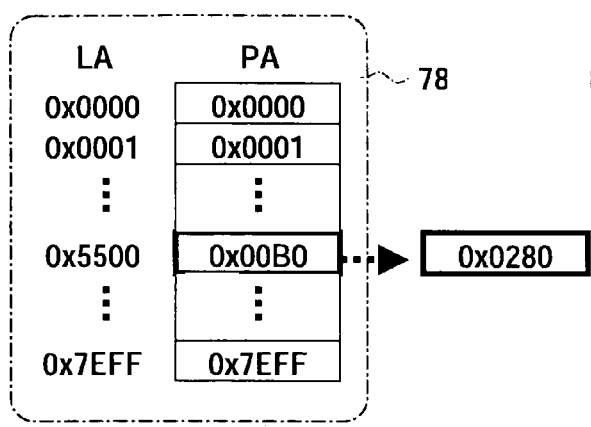
FIGS. 17A and 17B are diagrams showing an example of the configuration of the address conversion table of a control circuit and a management table of a page state according to the fifth embodiment of the present invention.
Figure 17B:
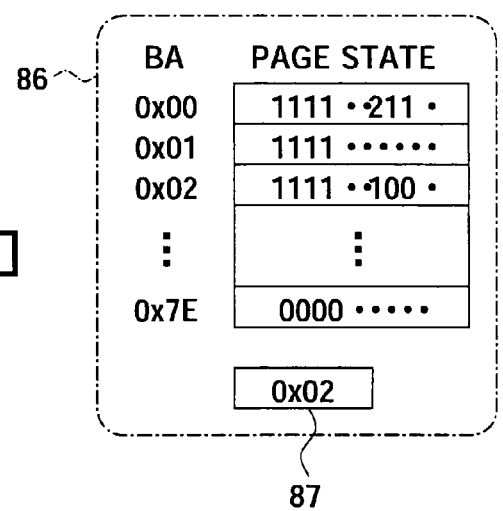

FIG. 16 is a view of a configuration showing a storage device according to the fifth embodiment of the present invention. FIGS. 17A and 17B are diagrams showing an example of the configuration of the address conversion table of the control circuit and the management table of the page state according to the fifth embodiment of the present invention. The configuration of a storage device 70 according to the fifth embodiment is basically the same as that of the first embodiment of the present invention. However, a RAM 77 built-in a control circuit 74 includes both an address conversion table 78 and a management table 86 of the page state.

The storage device 70 of FIG. 16 has an interface circuit (I/F) 71, a page buffer 72, an internal data bus 73, a control circuit 74, and NAND type flash memories 75 and 76 as principal components.

In the storage device 70, the 32-bit internal data bus 73 has two chips of the NAND type flash memories 75 and 76 having 16-bit input/outputs connected to it in parallel. The two chips of the flash memories 75 and 76 are simultaneously accessed in parallel in read and write operations. The page buffer 72 is a buffer for temporarily storing the accessed page region and is connected to an interface circuit 71 with the outside. The control circuit 74 is a controller for managing the transfer of data between the memory chips constituted by the flash memories 75 and 76 and the page buffer 72 and the interface circuit 71 and is controlled by a processing unit constituted by a built-in CPU 85. In the same way, the built-in RAM 77 provides a program region and a work area for controlling the CPU 85, the address conversion table 78, and the management table 86 of the page state.

The storage device 70 is accessed in the following way. Here, for simplification, assume that hexadecimal notation addresses are assigned as follows. For example, when the external input address is "0x5500C", the upper "0x5500" is the page address and the lower "0xC" is the sector address in the page region. The storage device 70 can perform the random access in units of 1 sector.

At the time of a read operation, when a sector address of "0x5500C" is input from the outside, the control circuit 74 receives the upper page address, accesses the built-in RAM 77, and acquires the physical page address (PA: PHYSICAL ADDRESS) "0x00B0" corresponding to the logical page address (LA: LOGICAL ADDRESS) "0x5500" from the address conversion table 78. The upper "0x00" in this physical page address PA is the address of the erasure blocks 83 and 84 in the flash memories 75 and 76 of the memory chips. The lower "0xB0" is the address of the page regions 79 and 80 in the erasure blocks. Both of the flash memories 75 and 76 of the memory chips are accessed based on this physical address PA, then the data of the page regions 79 and 80 stored at the page address "0x00B0" are read out from memories and stored in the page buffer 72. The interface circuit 71 selects the sector corresponding to the lower address "0xC" from among those and outputs the same to the outside.

On the other hand, when writing data into "0x5500C" from the outside, first the same routine as with a read operation is used to read out the data of the page regions 79 and 80 from the flash memories 75 and 76 of the memory chips and store them in the page buffer 72. Thereafter, the sector corresponding to the lower address "0xC" is selected and updated to the data input from the outside.

The updated page data are written back into the flash memories 75 and 76, but at that time, the data is not rewritten into the page regions 79 and 80 read from, but are written into the empty regions 81 and 82. The physical page address of these page regions is "0x0280", that is, corresponds to the page of "0x80" in the erasure block "0x02". Further, up to before this processing, those regions were unused empty pages not registered at any physical address field of the address conversion table 78. The updated data are written into these region in the form of additional writes and, at the same time, the physical page address "0x0280" of the empty regions 81 and 82 is registered in the physical address field corresponding to the logical address "0x5500" of the address conversion table 78.

In the management of the empty regions for additional writing update data in this way, for example the page state management table 86 as shown in FIG. 16 is constructed on the RAM 77. The present table records the states of pages stored in erasure blocks expressed by (BA: Block Address) by a 2-bit flag string. "0" indicates an empty region, "1" indicates a valid region after writing, and "2" indicates an invalid region.

In the state of FIGS. 17A and 17B, all of the physical page "0x80" and following pages at the block address "0x02" are the empty state. For example, in order to determine the empty region for the additional writing, the pointer to the block "0x02" set for searching at present is stored in the memory region 87. When there is a write request to a flash memory, the empty page regions are searched for by scanning the flags of this table from the upper page thereof. When all of the empty regions of a block are used, the pointer is incremented, then the empty page regions are searched for from the block of "0x03". By moving the pointer from the head to the tail end of the block addresses in this way, the entire flash memory region can be uniformly written in.

In the present configuration, two memory chips constituted by the flash memories 75 and 76 are formed in parallel, and the page data read out from these are stored in the page buffer 72 all together. At this time, the memory size used becomes 2 times the case of a single chip, but this operation is performed in block access units. The size of the page region, which is also the unit of management of the address conversion table 78, also becomes 2 times. Therefore, the number of pages also does not increase. Accordingly, the address conversion table 78 does not change, and the size of the memory (RAM) 77 for storing that does not increase. On the other hand, the increase of the number of erasures and the acceleration of the writing fatigue, the weak points of the parallel configuration, are greatly relieved by additional write type write operation using address conversion in units of pages.

Note that when rewriting a large file or otherwise rewriting an entire erasure block, the processing for caching the valid data is inherently unnecessary. Only block erasure is enough. Accordingly, there is no large difference in performance due to the employment of additional write type write operations. Accordingly, the general type rewrite operations and the additional write type rewrite operations may be combined in accordance with the case.

When performing an additional write type rewrite operation as explained above, the page regions 79 and 80 corresponding to the physical page address "0x00B0" storing the data before updating are deleted from the physical address fields of the address conversion table 78, so can no longer be accessed from the outside. Namely, they are invalidated. However, these have data written in them, so these cannot be used as they are as empty regions. When repeatedly rewriting data as explained above, many invalid page regions are generated. It is necessary to erase and restore them so that they can be used as empty regions again. Further, in that case, the valid data remaining in the erasure blocks 83 and 84 must be cached.

In such recovery processing, for example, first, the valid data in a target block is read out to the page buffer in the same way as the time of updating, then is additional written into the spare page region. This substantially caches the data. Namely, by temporarily updating a valid page, the original regions thereof are all invalidated. By erasing the target block after that, the recovery processing is executed.

Figure 18A:
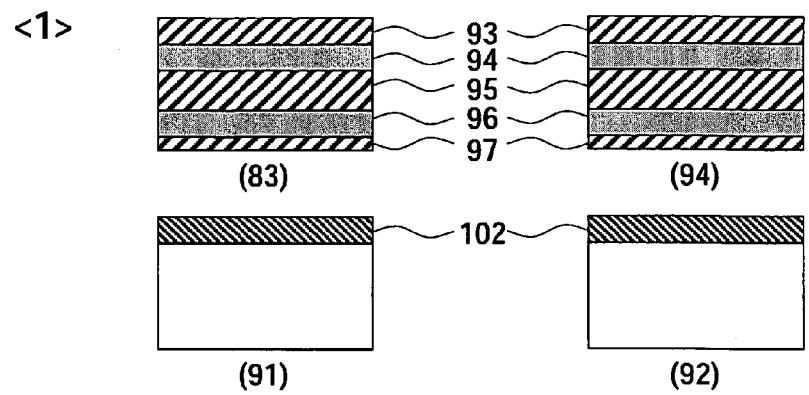
FIGS. 18A to 18C are diagrams for explaining a routine for recovery of an invalid region of the fifth embodiment of the present invention.
Figure 18B:
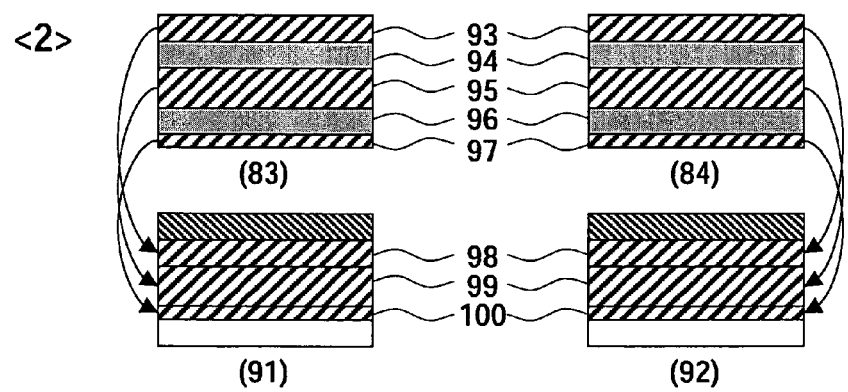
Figure 18C:
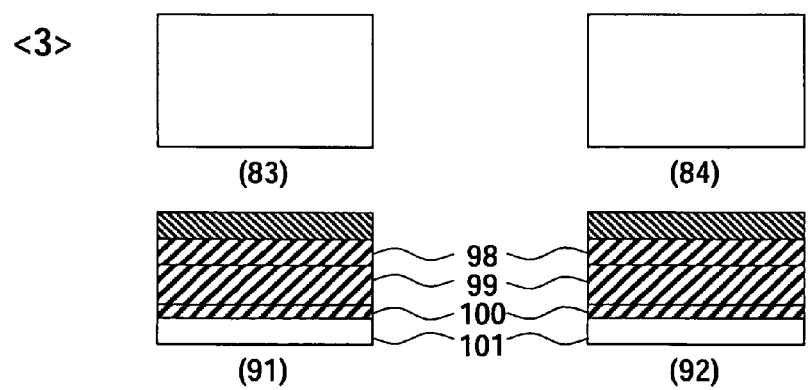

FIGS. 18A to 18C are diagrams for explaining the routine for recovery of invalid regions. FIGS. 18A to 18C illustrate the concrete routines <1>, <2>, and <3> for substantially restoring invalid page regions by caching the valid data inside the erasure blocks 83 and 84.

Routine <1>

Assume rewriting by additional write further proceeds from the state of FIGS. 17A and 17B, the erasure blocks 83 and 84 are written once with data, then the page region groups 94 and 96 are invalidated by updating and coexist with the valid page region groups 93, 95, and 97. Here, it is necessary to restore the invalidated regions to empty regions while leaving the data of the valid page regions. On the other hand, the blocks 91 and 92 are erasure blocks used as empty regions for additional write at present and are written in up to the page region 102.

Routine <2>

The valid page region groups 93, 95, and 97 are sequentially copied to the empty regions 98, 99, and 100 in the erasure blocks 91 and 92 by filling to the top. At this time, for example, when sequentially reading out one page region at a time from the erasure blocks 83 and 84 to the page buffer 72 of FIG. 16, the data are written into the erasure blocks 91 and 92 and, at the same time, the address conversion table 78 is updated. Namely, the physical page addresses copied to are registered in the physical address fields corresponding to the logical addresses of the page region. At this time, the logical address of each page region is described in the spare region thereof when the data is written into each page region and is acquired when the data is read out to the page buffer 72 at the time of copying. This operation is equivalent to the work (processing) of rewriting the valid region groups 93, 95, and 97 by the additional write method. Alternatively, it is possible to read out the data in the spare region to the page buffer 72 in advance, acquire the logical address first, then execute the processing for page update for that logical address. This enables the copying work and the updating work of the address conversion table 78 to be performed automatically by exactly the same program as the usual page update processing. In actuality, the data is not rewritten, but only copied, but all pages in the erasure blocks 83 and 84 are invalidated by this work, and the data of the valid page regions are substantially cached in the erasure blocks 91 and 92.

Routine <3>

The erasure blocks 83 and 84 are erased. Due to this, all of internal portions thereof become empty regions, and it becomes possible to use the same for the later additional writes. By this, the invalid regions 94 and 96 are effectively restored.

In this way, the recovery processing of the invalid page regions is formed by caching data by copying valid page regions and erasing original erasure blocks. Further, it is possible to apply dummy updating to the valid pages in an erasure block to be restored by the same routine as the usual update processing and thereby cache pages. By this, it is possible to combine the caching of the valid pages at the time of the recovery processing with the usual writing algorithm. In this case, not only does control becomes easy, but also various means for improving the reliability at the time of writing such as uniform writing into the flash memories can be applied to the recovery processing, so the overall reliability of the storage device can be improved.

The storage device using the present invention was explained above by concrete embodiments, but the configuration inside the device can be modified as well. For example, the page buffer 72 in FIG. 16 may be constructed in the RAM 77 inside the control circuit 74. In such case, the interface circuit 71, flash memories 75 and 76, and the control circuit 74 are connected by a common internal data bus 73. Alternatively, it is also possible to provide an error correction circuit using an ECC between the page buffer 72 and the flash memories 75 and 76, encode the data and add a parity bit at the time of writing page data into a flash memory from the page buffer, and decode data at the time of reading page data to the page buffer from the flash memories. The present invention can be applied irrespective of such differences of hardware configurations. Alternatively, as explained in the previously explained first to fourth embodiments, in order to skip defect blocks in the flash memories after address conversion in units of pages according to the address conversion tables 38 and 78, address conversion at the block level may be further inserted. In such a case as well, the present invention can be applied without problem by the same control as the examples explained before.

Figure 19:
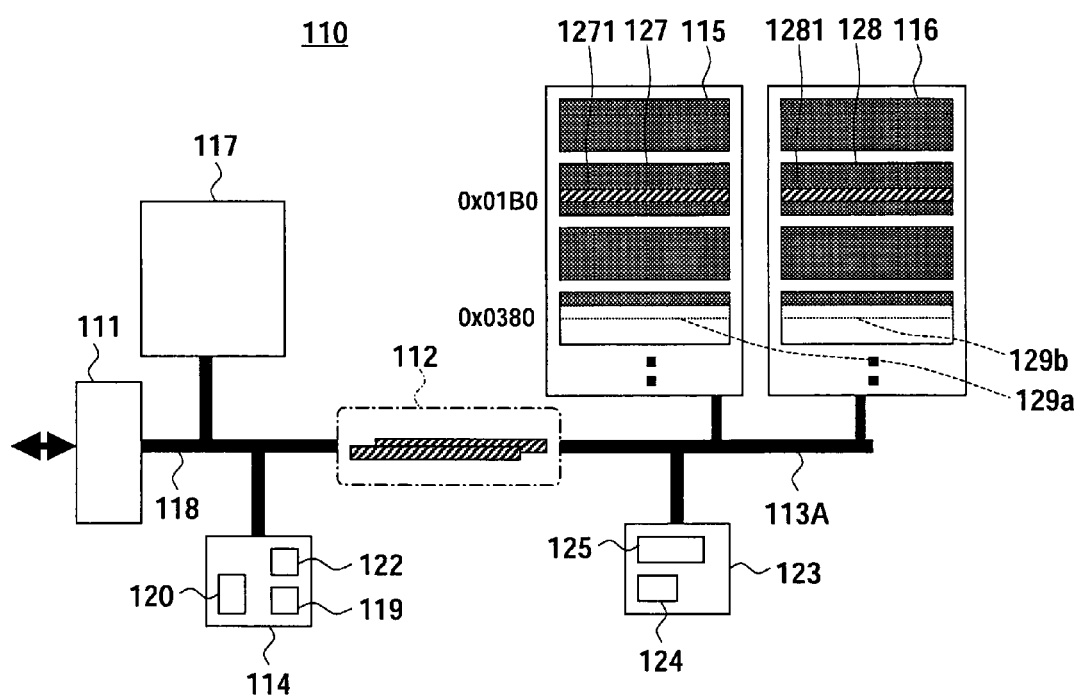
FIG. 19 is a diagram showing a sixth embodiment of the present invention which shows a modification of the hardware configuration of the fifth embodiment (FIG. 18) introducing ECC processing and defect block management.
Figures 20A, 20B:
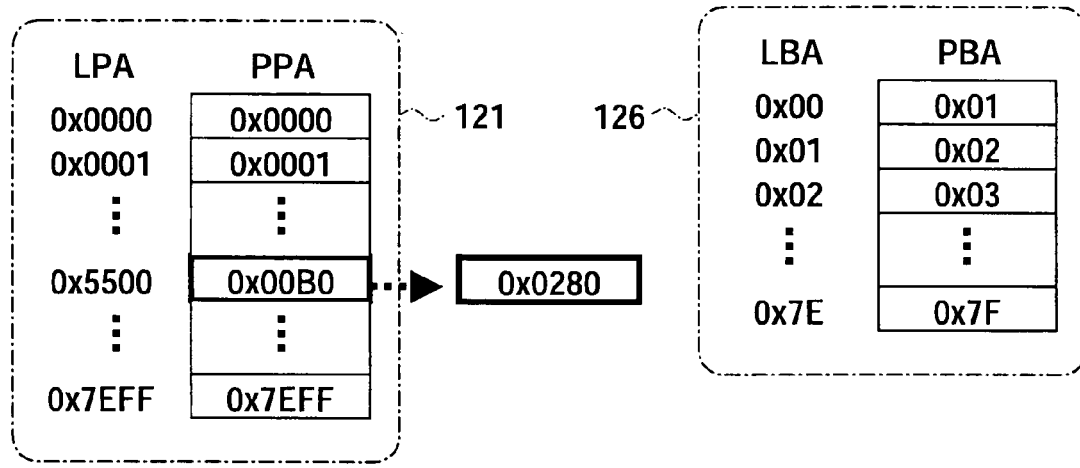
FIGS. 20A and 20B are diagrams showing an example of the configuration of an address conversion table of a control circuit and a management table of a page state according to a sixth embodiment of the present invention.

FIG. 19 is a diagram showing a sixth embodiment of the present invention and shows an example of a modification of the hardware configuration of the fifth embodiment (FIG. 18) introducing ECC processing and defect block management. FIGS. 20A and 20B are diagrams showing an examples of configuration of the address conversion table of the control circuit and the management table of the page state according to the sixth embodiment of the present invention.

In a storage device 110, a 32-bit internal data bus 113 has two chips constituted by NAND type flash memories 115 and 116 having 16-bit input/outputs connected to it in parallel. The two chips of the flash memories 115 and 116 are simultaneously accessed in parallel at the time of read and write operations. The page buffer 112 is a buffer for temporarily storing the accessed page region and connected via a second internal data bus 118 to an interface circuit 111 with the outside. Further, the second internal data bus 118 has a cache memory 117 connected to it. A control circuit 123 controls the transfer between the flash memories 115 and 116 and the page buffer 112. The control circuit 123 is provided with an address conversion table 126 for skipping defect blocks by address conversion in units of blocks in a built-in RAM 124 so that the defect blocks in the flash memories are not accessed. Further, the control circuit 123 is provided with an ECC circuit 125. This adds a parity bit by encoding when writing data into the flash memories 115 and 116 from the page buffer 112 and corrects error by decoding when reading data out from the flash memories 115 and 116 to the page buffer 112. The control circuit 114 is a controller for managing the transfer of the data among the page buffer 112, the cache memory 117, and the interface circuit 111 and is controlled by the built-in CPU 119. In the same way, in the built-in RAM 120, a program region and work area for controlling the CPU 119 are secured and an address conversion table 121 is constructed. Further, the control circuit 114 mounts a control circuit 122 controlling the data transfer between the cache memory 117 and the interface circuit 111 without control by the CPU. Note that, in the figure, illustration of the control lines is omitted.

The main difference of the sixth embodiment from the fifth embodiment (FIGS. 18A to 18C) resides in that the dedicated control circuit 123 for holding an address conversion table 126 and an ECC circuit 125 is provided for transfer between the page buffer 112 and the flash memories 115 and 116. Due to this, a logical address input from the outside receives a double conversion by the address conversion tables 121 and 126 when the flash memories 115 and 116 are accessed based on it. Further, conversion such as ECC encoding and decoding is also applied to the input/output data. The concrete operation will be explained below.

At the time of a read operation, when a sector address of "0x5500C" is input from the outside, the control circuit 114 receives the upper page address, accesses the built-in RAM 120, and acquires the physical page address (PPA: PHYSICAL PAGE ADDRESS) "0x00B0" corresponding to the logical page address (LPA: LOGICAL PAGE ADDRESS) "0x5500" from the address conversion table 121. The upper "0x00" in this physical page address PA indicates the address of the erasure block, but when this is further input to the control circuit 123, this portion is handled as the logical block address (LBA: LOGICAL BLOCK ADDRESS), and the physical block address (PBA: PHYSICAL BLOCK ADDRESS) "0x01" is acquired from the address conversion table 126. This is the address of the erasure blocks 127 and 128 in the memory chips of the flash memories 115 and 116.

On the other hand, the lower "0xB0" is the address of the page regions 1271 and 1281 in the erasure blocks 127 and 128. Both of the flash memories 115 and 116 are accessed based on this physical address, the data of the page regions 1271 and 1281 stored at the page address "0x01B0" are read out from the memories, ECC decoding is further applied, and the results are stored in the page buffer 112.

On the other hand, when writing data into "0x5500C" from the outside, a routine similar to that at the read operation is used to read out the data of the page regions 1271 and 1281 from the flash memories 115 and 116 and store them in the page buffer 112. Thereafter, a desired portion in the buffer is updated to the writing data. The updated page data is written back into the flash memories 115 and 116. At that time, the data are not rewritten into the page regions 1271 and 1281 read from, but are written into unused empty pages not registered in any physical address field of the address conversion table 121. Such empty pages are managed on the control circuit 114 side. For example, the management table 86 as in FIG. 16 is used, and the physical page address "0x0280" is selected. When the upper "0x02" in this is input to the control circuit 123, it is converted to "0x03" from the address conversion table 126, and the updated data of the page buffer 112 are written and transferred to page regions 129a and 129b of the memory chips of the flash memories 115 and 116. At this time, the parity bit by the ECC encoding is added to the data.

On the other hand, the control circuit 114 registers "0x0280" in the field of the physical page address corresponding to the logical page address "0x5500" of the address conversion table 121, and the original physical page address "0x00B0" is managed as the invalidated page region. All page addresses point to the correct page regions on the flash memories 115 and 116 after the conversion of the control circuit 123.

In the sixth embodiment, the physical page address derived by the control circuit 114 undergoes one-to-one conversion of the block level by the control circuit 123, but at that time, the relative locations of the pages in the same block do not change at all. Accordingly, the various types of conversions applied at the control circuit 123 may be regarded as "black boxes" from the control circuit 114. Namely, the control circuit 114 regards the memory chips of the flash memories 115 and 116 and the control circuit 123 as an integrally formed flash memory device. Even if accessing these by an independent logic, no inconsistency occurs. This same is true also for the encoding and decoding by ECC. As a result, it becomes possible for the control circuit 114 to execute the recovery processing of the invalidated regions by exactly the same algorithm as that of the fifth embodiment of the present invention.

Up to here, the case where an address conversion mechanism and a recovery processing mechanism were provided inside independent storage devices was explained. However, it is also possible to execute such management and recovery processing of the address conversion table by host side control. Such a computer system is shown in FIG. 21 as a seventh embodiment of the present invention.

Figure 21:
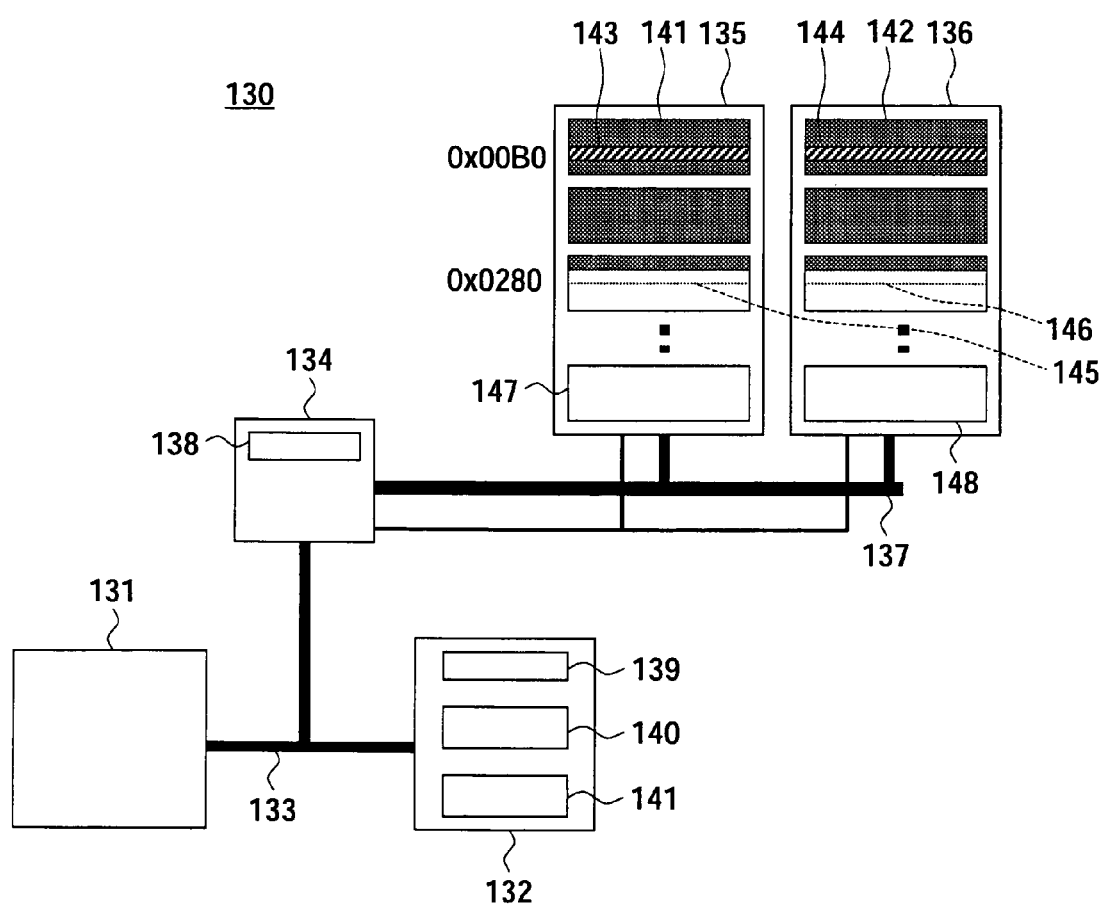
FIG. 21 is a diagram showing an example of the configuration of a computer system according to a seventh embodiment of the present invention.
Figure 22:
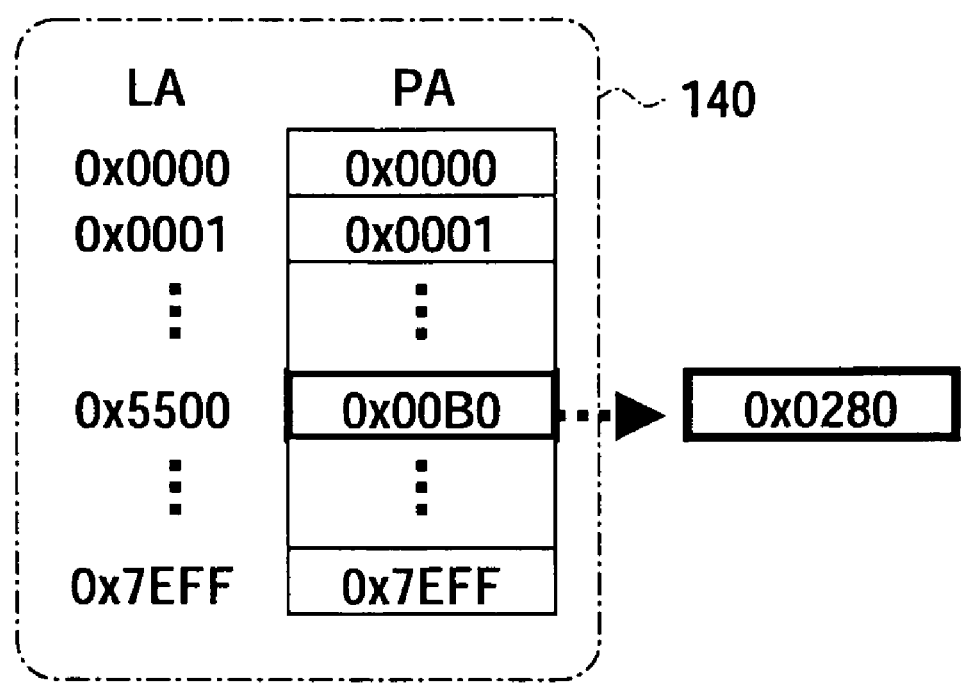
FIG. 22 is a diagram showing an example of the configuration of an address conversion table of a control circuit according to the seventh embodiment of the present invention.

FIG. 21 is a diagram showing an example of the configuration of a computer system according to the seventh embodiment of the present invention. Further, FIG. 22 is a diagram showing an example of the configuration of the address conversion table of the control circuit according to the seventh embodiment of the present invention.

A computer system 130 of FIG. 21 has a processing unit constituted by a CPU 131, a system memory constituted by a RAM 132, a system bus 133, a bridge circuit 133, NAND type flash memories 135 and 136, a data bus 137, and a page buffer 138 as principal components.

The CPU 131 is connected to the system memory constituted by the RAM 132 via a 32-bit system bus 133. Further, the system bus 133 has a bridge circuit 134 connected to it. A 32-bit data bus 137 linked with the bridge circuit 134 has two chips of NAND type flash memories 135 and 136 with 16-bit input/outputs connected to it in parallel. The two chips of the flash memories 135 and 136 are simultaneously accessed in parallel at the time of read and write operations. The page buffer 138 is a buffer for temporarily storing the accessed page regions and is built-in the bridge circuit 134. The bridge circuit 134 receives various types of commands from the CPU 131 and mediates the transfer of the data between the flash memories 135 and 136 and the CPU 131 or system memory 132 by using the page buffer 138. The commands received by the bridge circuit 134 include, other than for example access to predetermined pages of the flash memories 135 and 136, erasing of a predetermined block of the same flash memory, copying to a designated address of the predetermined page, and reset of the flash memory, etc.

On the other hand, the system memory 132 has a driver 139 for controlling the flash memory system resident in it. This driver 139 receives an access request to the storage device from OS or application and converts the page address at the time of the access with reference to the address conversion table 140 constructed in the same memory.

The storage system is accessed as follows. Here, for simplification, assume that the hexadecimal notation addresses are assigned as follows. For example, when the external input address is "0x5500C", the upper "0x5500" is the page address and the lower "0xC" is the sector address in the page region. The storage device can perform random access in units of 1 sector.

At the time of a read operation, when for example reading of the sector of the address "0x5500C" is requested from an application, the driver 139 receives the upper page address and acquires the physical page address (PA: PHYSICAL ADDRESS) "0x00B0" corresponding to the logical page address (LA: LOGICAL ADDRESS) "0x5500" from the address conversion table 140. The upper "0x00" in this physical page address PA is the address of the erasure blocks 141 and 142 in the memory chips of the flash memories 135 and 136. The lower "0xB0" is the address of the page regions 143 and 144 in the erasure blocks. Both of the memory chips of the flash memories 135 and 136 are accessed via the bridge circuit 134 based on this physical address, then the data in the page regions 143 and 144 stored at the page address "0x00B0" are read out from the memories and stored in the page buffer 138. The bridge circuit 134 selects the sector corresponding to the lower address "0xC" from among those and outputs the same to the CPU 131 or the system memory 132.

On the other hand, when a writing request to "0x5500C" is received from the application, first, a routine similar to that for the read operation is used for the address conversion by the driver 139 and the reading of the data of the page regions 143 and 144 from the memory chips of the flash memories 135 and 136 and store them in the page buffer 138. Thereafter, the sector corresponding to the lower address "0xC" is selected and updated to the new data. The updated page data are written back into the flash memories 135 and 136. At that time, they are written into the empty regions 145 and 146 of the memories. The physical page address of this page region is "0x0280", that is, corresponds to the page of "0x80" in the erasure block "0x02". Further, up to before this processing, that region was an unused empty page not registered in any physical address field of the address conversion table 140. The updated data is written into this region in the form of an additional write. At the same time, the physical page address "0x0280" of the empty regions 145 and 146 is registered in the physical address field corresponding to the logical address "0x5500" of the address conversion table 140.

When an additional write type write operation as explained above is executed, the page regions 143 and 144 corresponding to the physical page address "0x00B0" at which the data before updating was stored are deleted from the physical address fields of the address conversion table 140 and invalidated. However, these have data written in them, so they cannot be used as empty regions as they are. When repeatedly rewriting data as explained above, many invalid page regions are generated. It is necessary to erase and restore them so that they can be used as empty regions again. Further, in that case, the valid data remaining in the erasure blocks 141 and 142 must be cached.

Such recovery processing is carried out by using the blocks 147 and 148 having empty regions by for example the same algorithm as that explained before with reference to FIGS. 18A to 18C. Namely, the data of the valid page region groups in the erasure blocks 141 and 142 for the recovery processing are sequentially copied to the empty regions in the caching blocks 147 and 148 by filling to the top. The physical address of the address conversion table 140 is updated in accordance with that. When all valid page data finishes being copied, the original blocks 141 and 142 are erased.

In the ninth embodiment, the driver 139 is used to sends command from the host CPU 131 to the bridge circuit 134 for controlling the processing (work) there. For example, the valid page data is copied in the above recovery work by the bridge circuit 134 reading out the predetermined page from the copying side to the page buffer 138 in response to a copy command from the host CPU 131 and writing the same at the destination of the copying. Alternatively, the predetermined block is erased. At that time, the system bus 133 is not used, therefore, if necessary, it is also possible for the CPU 131 to execute other processing (work) in parallel after transmitting the command.

Note that, even in such a system, as explained in the previously explained first to sixth embodiments, after executing the address conversion in units of pages according to the address conversion table 140, in order to skip defect blocks in the flash memories, address conversion at the block level may be further inserted.

As explained above, in the present storage device, in order to counter the disadvantages in a flash memory, the inventors took note of additional-write type storage system. In such a system, the rewriting is executed by writing the updated data into an empty region and invalidating the original data. More specifically, an address conversion table linking logical addresses with physical addresses is used, and data is rewritten by changing the physical address of the data concerned and additionally writes into an empty region of the storage medium. As a related art of this technique, for example Japanese Patent Publication (A) No. 8-328762 discloses details of a method of management in an additional-write type storage system using an address conversion table. Note that this assumes a single chip, so there is the disadvantage that the address conversion table becomes huge along with an increase in the capacity. The storage devices of the embodiments overcome this. Further, the storage devices of the embodiments function as follows to enable application to the recent increasingly larger capacity flash memories.

1. Operates as an additional-write type storage system with a sufficient reliability while observing a sequence restriction of page writing explained above.

2. Deals with the fact that large capacity non-volatile memories frequently include internal defects. Particularly, in a flash memory, a single defect exerts an adverse influence upon the entire erasure block, therefore the units of writing and the units of defect management differ in many cases. The present storage device achieves such defect management together with the above system.

3. Updates data by the additional write format not immediately erasing the storage region of old data, but invalidating it. In a flash memory, a means for restoring such an invalidated region to an empty region is necessary. The present storage device suitably restores regions under the above restrictions.

Summarizing the effects of the embodiments of the invention, according to the embodiments of the present invention, when using for example a flash memory as a storage medium, a storage system having a high reliability and high speed can be realized. According to the embodiments of the present invention, further, it is possible to greatly reduce the degradation of the transfer rate and the deterioration of writing along with the erasure in unit of blocks and the restriction on the data writing sequence in a block. According to the embodiments of the present invention, still further, high speed rewriting can be constantly realized in practical use while using the flash memory as a storage medium. Also, the number of erasures can be reduced and rewriting fatigue can be reduced to enable highly reliable rewriting. Further, defective blocks can be flexibly replaced while improving the performance in this way, regions invalidated in the flash memory can be suitably restored, and any address conversion table destroyed due to momentary power interruptions etc. can be reconstructed without any inconsistency.

It should be understood by those skilled in the art that various modifications, combinations, sub-combinations and alterations may occur depending on design requirements and other factors insofar as they are within the scope of the appended claims or the equivalents thereof.

What we claim is:

1. A storage device comprising:
a flash memory including a plurality of flash memory units accessed in parallel;
a page register for acquiring data in parallel from two or more of the plurality of flash memory units and temporarily storing the data; and
an address conversion table for managing correspondence between logical addresses and physical addresses in units of data stored in the page register in parallel;
the storage device being configured for rewriting data by updating of the address conversion table and additional writing into a storage medium,
wherein the data has a spare region and that the spare region contains the logical address of the data and information indicating an update history of the data, and
wherein the spare region is provided with a counter for holding the cumulative number of updates for all logical addresses or the cumulative number of updates for each of the divided logical addresses, and increments the counter number corresponding to the time of the writing of the data into the storage medium.

2. A storage device as set forth in claim 1, wherein the unit of data stored in the page register includes a plurality of sectors, and the storage device accesses data in units of sectors.

3. A storage device comprising:
an address conversion table showing correspondence between logical addresses and physical addresses; and
a part for storing data according to the address conversion table and rewriting data by updating of the address conversion table and additional writing into a storage medium, wherein
the data has a spare region,
that spare region contains the logical address of the data and information indicating an update history of the data, and
wherein the spare region is provided with a counter for holding the cumulative number of updates for all logical addresses or the cumulative number of updates for each of the divided logical addresses, and increments the counter number corresponding to the time of the writing of the data into the storage medium.

4. A storage device as set forth in claim 3, wherein the update history includes a time stamp at the time of writing the data into the storage medium.

5. A storage device as set forth in claim 3, wherein the update history includes the number of times of updating of the data in the storage medium.

6. A storage device as set forth in claim 3, wherein the device has a part of scanning the storage medium and reconstructing the address table based on the logical address and the update history of the spare region.

* * * * *